US012660687B2

(12) United States Patent
Cha et al.

(10) Patent No.: US 12,660,687 B2
(45) Date of Patent: Jun. 16, 2026

(54) DISPLAY DEVICE

(71) Applicant: Samsung Display Co., LTD., Yongin-si (KR)

(72) Inventors: Na Hyeon Cha, Yongin-si (KR); Sun Kwun Son, Yongin-si (KR); Dong Hee Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 710 days.

(21) Appl. No.: 17/870,675

(22) Filed: Jul. 21, 2022

(65) Prior Publication Data

US 2023/0086882 A1 Mar. 23, 2023

(30) Foreign Application Priority Data

Sep. 17, 2021 (KR) ........................ 10-2021-0125175

(51) Int. Cl.
  H10W 90/00 (2026.01)
  H10D 86/40 (2025.01)
  (Continued)

(52) U.S. Cl.
  CPC .......... H10W 90/00 (2026.01); H10D 86/441 (2025.01); H10D 86/481 (2025.01); H10D 86/60 (2025.01); H10H 20/857 (2025.01); H10W 70/60 (2026.01); H10W 70/654 (2026.01); H10W 90/22 (2026.01)

(58) Field of Classification Search
  CPC ....... H01L 25/167; H01L 24/24; H01L 24/25; H01L 2224/24051; H01L 2224/24146;

H01L 2224/245; H01L 2224/25175; H01L 2924/0549; H01L 25/0753; H10D 86/441; H10D 86/481; H10D 86/60; H10H 20/857; H10H 20/8506; H10H 29/142;

(Continued)

(56) References Cited

U.S. PATENT DOCUMENTS 9,659,966 B2 5/2017 Kwak et al.
10,128,322 B2 * 11/2018 Hong .................. H10K 59/131
(Continued)

FOREIGN PATENT DOCUMENTS

KR 10-2020-0097869 A 8/2020
KR 10-2222680 B1 3/2021
(Continued)

*Primary Examiner* — Tan N Tran
(74) *Attorney, Agent, or Firm* — Womble Bond Dickinson (US) LLP

(57) ABSTRACT

A display device may include: a first power line and a second power line located on a substrate; a first electrode electrically connected to the first power line through a first contact portion; a second electrode electrically connected to the second power line through a second contact portion and spaced apart from the first electrode in a first direction; a light emitting element located on the first electrode and the second electrode; and a pixel circuit including a transistor and a storage capacitor, and electrically connected to the light emitting element. The first contact portion may include a plurality of first contact portions successively arranged in the first direction. In a plan view, the storage capacitor may have a shape extending in a second direction different from the first direction.

17 Claims, 13 Drawing Sheets

(51) Int. Cl.

| | | |
|---|---|---|
| *H10D 86/60* | (2025.01) | |
| *H10H 20/857* | (2025.01) | |
| *H10W 70/60* | (2026.01) | |
| *H10W 70/654* | (2026.01) | |
| *H10W 90/22* | (2026.01) | |

(58) Field of Classification Search
CPC ... H10W 90/00; H10W 70/60; H10W 70/654;
H10W 90/22
See application file for complete search history.

(56) References Cited

U.S. PATENT DOCUMENTS

| | | | |
|---|---|---|---|
| 11,063,104 B2 * | 7/2021 | Kim ..................... | H10K 59/123 |
| 12,015,022 B2 * | 6/2024 | Tian ..................... | H10H 20/855 |
| 2020/0118508 A1 * | 4/2020 | Park ..................... | G09G 3/3677 |
| 2020/0135829 A1 * | 4/2020 | Kim ................... | H10K 59/1216 |
| 2020/0258938 A1 | 8/2020 | Chai et al. | |
| 2021/0143137 A1 | 5/2021 | Kim et al. | |
| 2021/0265329 A1 | 8/2021 | Woo et al. | |

FOREIGN PATENT DOCUMENTS

| | | | |
|---|---|---|---|
| KR | 10-2021-0057891 A | 5/2021 | |
| KR | 2021-0095774 A | 8/2021 | |

* cited by examiner

LD

D

L

INF

LD

EP2

ELL

SEC2

AL

INF

SEC1

| | |
|---|---|
| SECOND CONTACT ELECTRODE LAYER | ~CNE2 |
| FIRST CONTACT ELECTRODE LAYER | ~CNE1 |
| ALIGNMENT ELECTRODE LAYER | ~ELT |
| PASSIVATION LAYER | ~PSV |
| SECOND INTERLAYER INSULATING LAYER | ~ILD2 |
| SOURCE/DRAIN ELECTRODE LAYER | ~SDL |
| FIRST INTERLAYER INSULATING LAYER | ~ILD1 |
| GATE ELECTRODE LAYER | ~GE |
| GATE INSULATING LAYER | ~GI |
| ACTIVE LAYER | ~ACT |
| BUFFER LAYER | ~BFL |
| BARRIER ELECTRODE LAYER | ~BML |
| SUBSTRATE | ~SUB |

DR3

FIG. 11

DISPLAY DEVICE

CROSS-REFERENCE TO RELATED APPLICATION

This application claims priority to, and the benefit of, Korean patent application number 10-2021-0125175 filed on Sep. 17, 2021, the entire disclosure of which is incorporated herein in its entirety by reference.

BACKGROUND

1. Field

Various embodiments of the present disclosure relate to a display device.

2. Description of Related Art

Recently, as interest in information display increases, research and development on display devices have been continuously conducted.

SUMMARY

Various embodiments of the present disclosure are directed to a display device in which an area, which is large enough to arrange light emitting elements therein, may be secured, so that emission efficiency may be increased, and suitable power consumption may be reduced.

The present disclosure is not limited to the above-described aspects, and other aspects that are not mentioned will be clearly understood by those skilled in the art from the following description.

A display device in accordance with some embodiments may include a first power line and a second power line on a substrate, a first electrode electrically connected to the first power line through a first contact portion of first contact portions successively arranged in a first direction, a second electrode electrically connected to the second power line through a second contact portion of second contact portions, and spaced apart from the first electrode in the first direction, a light emitting element on the first electrode and the second electrode, and a pixel circuit electrically connected to the light emitting element, and including a transistor, and a storage capacitor having a shape extending in a second direction that is different from the first direction in plan view.

The display device may further include a first sub-pixel configured to emit a light of a first color, a second sub-pixel configured to emit a light of a second color, and a third sub-pixel configured to emit a light of a third color, wherein the second direction crosses a direction in which the first sub-pixel, the second sub-pixel, and the third sub-pixel are spaced apart from each other.

The display device may further include a first sub-pixel configured to emit a light of a first color, a second sub-pixel configured to emit a light of a second color, and a third sub-pixel configured to emit a light of a third color, wherein the storage capacitor includes a first storage capacitor in the first sub-pixel, a second storage capacitor in the second sub-pixel, and a third storage capacitor in the third sub-pixel, and wherein the first storage capacitor, the second storage capacitor, and the third storage capacitor are spaced apart from each other in a same direction in which the first sub-pixel, the second sub-pixel, and the third sub-pixel are spaced apart from each other.

A maximum length or width of the storage capacitor with respect to the first direction may be less than a maximum length or width of the storage capacitor with respect to the second direction.

The first power line may extend in a direction crossing the second direction.

The display device may further include a first sub-pixel configured to emit a light of a first color, a second sub-pixel configured to emit a light of a second color, and a third sub-pixel configured to emit a light of a third color, wherein the first power line extends in a same direction in which the first sub-pixel, the second sub-pixel, and the third sub-pixel are spaced apart from each other.

The first power line may extend in the first direction, and is between the first contact portion and the storage capacitor.

The first contact portion might not overlap the first power line, in plan view, and may be electrically connected to the first power line by an electrode pattern at a same layer as the first power line.

The display device may further include a common connection electrode formed integrally with the second electrode, wherein the first contact portion overlaps the first electrode, and the second contact portion overlaps the common connection electrode, in plan view.

The display device may further include a bank protruding in a thickness-wise direction of the substrate, and defining a second opening in which the first contact portion and the second contact portion are located, and in which the light emitting element is not located, and a first opening overlapping an emission area in which the light emitting element is located.

The first contact portion and the second contact portion might not overlap the bank in plan view, wherein at least a portion of the storage capacitor does not overlap the bank in plan view.

The first contact portions may be arranged along a first line extending in the first direction, wherein the second contact portions are arranged along a second line extending in the first direction, and wherein the storage capacitor is between the first line and the second line.

The first direction may cross a direction in which the storage capacitor extends.

The display device may further include a first sub-pixel configured to emit a light of a first color, a second sub-pixel configured to emit a light of a second color, and a third sub-pixel configured to emit a light of a third color, wherein the storage capacitor includes a first storage capacitor for the first sub-pixel, a second storage capacitor for the second sub-pixel, and a third storage capacitor for the third sub-pixel, and wherein a direction in which the first storage capacitor, the second storage capacitor, and the third storage capacitor are arranged is substantially parallel with the first direction.

The display device may further include sub-pixels including the light emitting element, and a color conversion layer including a wavelength conversion pattern such that the sub-pixels emit different colors of light.

The sub-pixels may include a first sub-pixel configured to emit a light of a first color, a second sub-pixel configured to emit a light of a second color, and a third sub-pixel configured to emit a light of a third color, wherein the light emitting element is configured to emit the light of a third color.

The wavelength conversion pattern may include a quantum dot configured to change a wavelength of light.

The display device may further include a color filter layer on the color conversion layer, and configured to allow a corresponding color of light to selectively pass therethrough.

A display device in accordance with some embodiments may include a first sub-pixel including a first pixel circuit including a first storage capacitor that extends in a second direction, and configured to emit a light of a first color, and a second sub-pixel spaced from the first sub-pixel in a first direction crossing the second direction, including a second pixel circuit including a second storage capacitor that extends in the second direction and that is spaced from the first storage capacitor in the first direction, and configured to emit a light of a second color.

A display device in accordance with some embodiments may include a substrate, a first electrode and a second electrode on the substrate, a light emitting element on the first electrode and the second electrode, a pixel circuit electrically connected to the light emitting element, and including a storage capacitor, and a power line electrically connected to the first electrode through a contact portion, electrically connected to the light emitting element, extending in a first direction, and located between the contact portion and the storage capacitor in plan view.

The aspects of the present disclosure may not be limited to the above, and other aspects of the present disclosure will be clearly understandable to those having ordinary skill in the art from the disclosures provided below together with accompanying drawings.

BRIEF DESCRIPTION OF THE DRAWINGS

FIG. 5 is a sectional view for describing a stacked structure included in a display device in accordance with some embodiments.

FIG. 11 is a plan view illustrating a pixel in accordance with some embodiments.

DETAILED DESCRIPTION

Figures 1, 2:
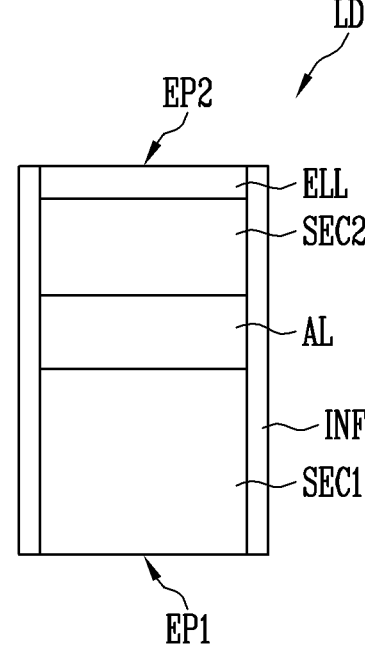
FIGS. 1 and 2 are a perspective view and a sectional view illustrating a light emitting element in accordance with some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the

US 12,660,687 B2 high5 device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, high6 layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A light emitting element LD included in a display device (refer to "DD" of FIG. 3) in accordance with some embodiments will be described with reference to FIGS. 1 and 2.

FIGS. 1 and 2 illustrate the light emitting element LD included in the display device in accordance with some embodiments. FIGS. 1 and 2 are a perspective view and a sectional view illustrating the light emitting element LD in accordance with some embodiments.

Referring to FIGS. 1 and 2, the light emitting element LD may include a first semiconductor layer SEC1, a second semiconductor layer SEC2, and an active layer AL interposed between the first semiconductor layer SEC1 and the second semiconductor layer SEC2. The light emitting element LD may further include an electrode layer ELL. In some embodiments, the first semiconductor layer SEC1, the active layer AL, the second semiconductor layer SEC2, and the electrode layer ELL may be successively stacked in a longitudinal direction (L) of the light emitting element LD.

The light emitting element LD may include a first end EP1 and a second end EP2. The first semiconductor layer SEC1 may be adjacent to the first end EP1 of the light emitting element LD. The second semiconductor layer SEC2 and the electrode layer ELL may be adjacent to the second end EP2 of the light emitting element LD.

In some embodiments, the light emitting element LD may have a pillar shape. The pillar shape may refer to a shape, such as a cylindrical shape or a prismatic shape, which extends in the longitudinal direction (L). In other words, the length L of the light emitting element LD may be greater than a diameter D thereof (or a width of the cross-section thereof). The shape of the cross-section of the light emitting element LD may include a rod-like shape and a bar-like shape, but the present disclosure is not limited thereto.

The light emitting element LD may have a size corresponding to a range from the nanometer scale to the micrometer scale. For example, the diameter D (or the width) and the length L of the light emitting element LD each may have a size ranging from the nanometer scale to the micrometer scale, but the present disclosure is not limited thereto.

The first semiconductor layer SEC1 may be a first conductive semiconductor layer. For example, the first semiconductor layer SEC1 may include an N-type semiconductor layer. For instance, the first semiconductor layer SEC1 may include an N-type semiconductor layer which includes any one semiconductor material of InAlGaN, GaN, AlGaN, InGaN, AlN, and InN and is doped with a first conductive dopant such as Si, Ge, or Sn. However, the constituent material of the first semiconductor layer SEC1 is not limited thereto, and the first semiconductor layer SEC1 may be formed of various other materials.

The active layer AL may be located on the first semiconductor layer SEC1. The active layer AL may be located between the first semiconductor layer SEC1 and the second semiconductor layer SEC2.

The active layer AL may include any one of AlGaInP, AlGaP, AlInGaN, InGaN, and AlGaN. For example, to enable the active layer AL to output red light, the active layer AL may include AlGaInP and/or InGaN. To enable the active layer AL to emit green light or blue light, the active layer AL may include InGaN. However, the present disclosure is not limited to the foregoing example.

The active layer AL may have a single-quantum well structure or a multi-quantum well structure.

The second semiconductor layer SEC2 may be located on the active layer AL and include a semiconductor layer having a type that is different from that of the first semiconductor layer SEC1. For example, the second semiconductor layer SEC2 may include a P-type semiconductor layer. For instance, the second semiconductor layer SEC2 may include a P-type semiconductor layer which includes any one semiconductor material of InAlGaN, GaN, AlGaN, InGaN, AlN, and InN, and is doped with a second conductive dopant such as Mg. However, the material for forming the second semiconductor layer SEC2 is not limited thereto, and the second semiconductor layer SEC2 may be formed of various other materials.

The electrode layer ELL may be formed on the second semiconductor layer SEC2. The electrode layer ELL may include metal or metal oxide. In accordance with some embodiments, the electrode layer ELL may include at least any one of Cr, Ti, Al, Au, Ni, ITO, IZO, ITZO, and an oxide or alloy thereof.

If a voltage equal to or greater than a threshold voltage is applied between the opposite ends of the light emitting element LD, the light emitting element LD may emit light by coupling of electron-hole pairs in the active layer AL. Because light emission of the light emitting element LD may be controlled based on the foregoing principle, the light emitting element LD may be used as a light source of various light emitting devices as well as a pixel of the display device DD.

The light emitting element LD may further include an insulating film INF provided on a surface of the light emitting element LD. The insulating film INF may have a single-layer structure or a multi-layer structure.

The insulating film INF may allow the opposite ends of the light emitting element LD that have different polarities to be exposed to the outside. For example, the insulating film INF may allow a portion of the first semiconductor layer SEC1 located adjacent to the first end EP1 and a portion of the electrode layer ELL located adjacent to the second end EP2 to be exposed to the outside.

The insulating film INF may include at least one of silicon oxide ($SiO_x$), silicon nitride ($SiN_x$), silicon oxynitride ($SiO_xN_y$), aluminum oxide ($AlO_x$), and titanium dioxide ($TiO_x$). The present disclosure is not limited to a specific example.

The insulating film INF may secure electrical stability of the light emitting element LD. In addition, even in case that a plurality of light emitting elements LD are located adjacent to each other, the likelihood of an undesired short-circuit occurring between the light emitting elements LD may be reduced or prevented.

In some embodiments, the light emitting element LD may further include additional other components as well as the first semiconductor layer SEC1, the active layer AL, the second semiconductor layer SEC2, the electrode layer ELL, and the insulating film INF. For example, the light emitting element LD may further include a fluorescent layer, an active layer, a semiconductor layer, and/or an electrode layer.

Figure 3:
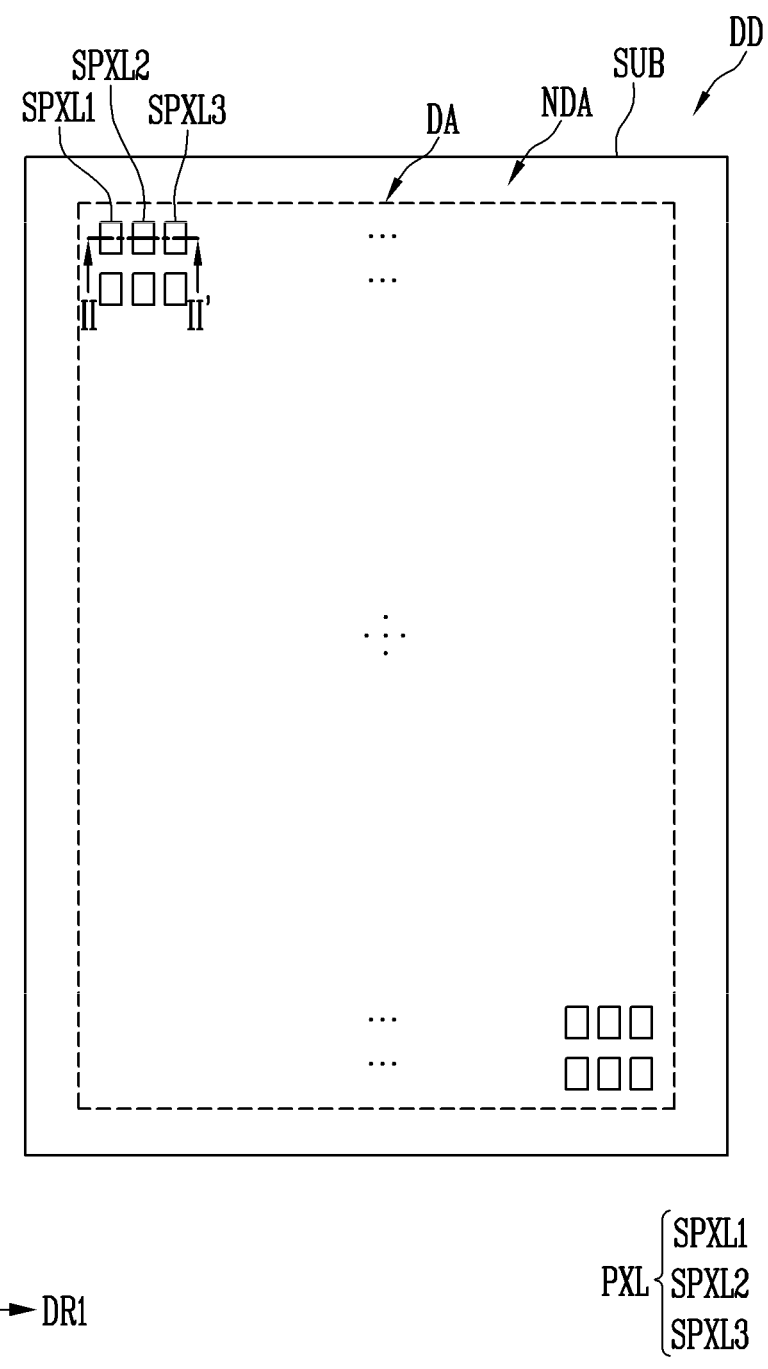
FIG. 3 is a plan view schematically illustrating a display device in accordance with some embodiments.

FIG. 3 is a plan view schematically illustrating a display device in accordance with some embodiments.

The display device DD may emit light. Referring to FIG. 3, the display device DD may include a substrate SUB, and pixels PXL located on the substrate SUB. In some embodiments, the display device DD may further include a driving circuit layer (e.g., a scan driver and a data driver) configured to drive the pixels PXL, lines, and pads.

The display device DD may include a display area DA and a non-display area NDA. The non-display area NDA may refer to an area other than the display area DA. The non-display area NDA may enclose at least a portion of the display area DA. In some embodiments, the non-display area NDA may be located in the display area DA, depending on embodiments.

The substrate SUB may form a base of the display device DD. The substrate SUB may be a rigid or flexible substrate or film, but is not limited to a specific example.

The display area DA may refer to an area in which the pixels PXL are located. The non-display area NDA may refer to an area in which the pixels PXL are not located. The driving circuit layer, the lines, and the pads which are connected to the pixels PXL of the display area DA may be located in the non-display area NDA. For example, the pixels PXL may be arranged in a stripe or PENTILE™ arrangement structure or the like, but the present disclosure is not limited thereto (e.g., a PENTILE™ matrix structure, a PENTILE™ structure, or an RGBG structure). PEN-TILE™ is a registered trademark of Samsung Display Co., Ltd., Republic of Korea. Various known embodiments may be applied to the arrangement structure of the pixels PXL.

In some embodiments, the pixel PXL may include a first sub-pixel SPXL1, a second sub-pixel SPXL2, and a third sub-pixel SPXL3. The first sub-pixel SPXL1, the second sub-pixel SPXL2, and the third sub-pixel SPXL3 each may be a sub-pixel. At least one first sub-pixel SPXL1, at least one second sub-pixel SPXL2, and at least one third sub-pixel SPXL3 may form one pixel unit which emits various colors of light.

For example, the first sub-pixel SPXL1, the second sub-pixel SPXL2, and the third sub-pixel SPXL3 each may emit light having a respective color (e.g., a predetermined color). For instance, the first sub-pixel SPXL1 may be a red pixel configured to emit red (e.g., first color) light, the second sub-pixel SPXL2 may be a green pixel configured to emit green (e.g., second color) light, and the third sub-pixel SPXL3 may be a blue pixel configured to emit blue (e.g., third color) light. However, the color, type, and/or number of the first sub-pixel SPXL1, the second sub-pixel SPXL2, and the third sub-pixel SPXL3, which may form each pixel unit, is not limited to a specific example.

Figure 4:
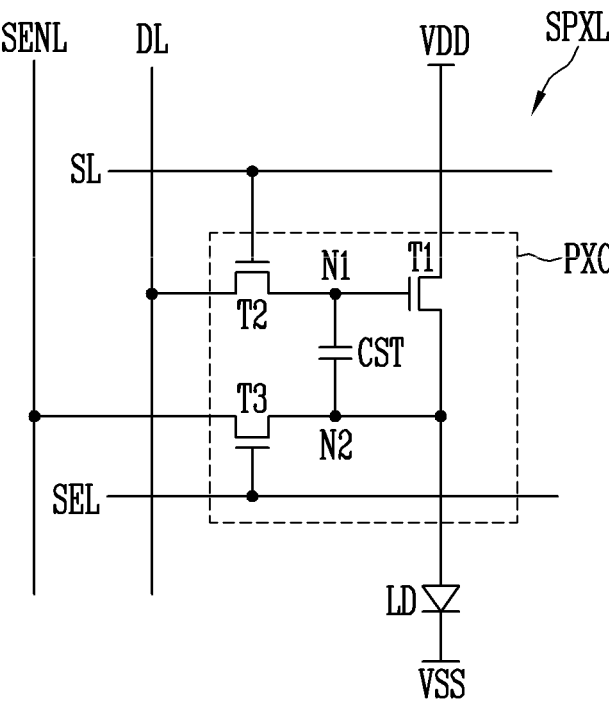
FIG. 4 is a circuit diagram illustrating a pixel circuit included in a sub-pixel in accordance with some embodiments.

FIG. 4 is a circuit diagram illustrating a pixel circuit included in a sub-pixel in accordance with some embodiments. The illustration of FIG. 4 is made for the first to third sub-pixels SPXL1, SPXL2, and SPXL3 described with reference to FIG. 3. For the sake of explanation, any one of the first to third sub-pixels SPXL1, SPXL2, and SPXL3 will be designated as a sub-pixel SPXL.

Referring to FIG. 4, the sub-pixel SPXL may include a light emitting element LD and a pixel circuit PXC. The pixel circuit PXC may drive the sub-pixel SPXL. The pixel circuit PXC may be electrically connected to the light emitting element LD.

The light emitting element LD may be connected between a first power line VDD and a second power line VSS. One end (e.g., a P-type semiconductor) of the light emitting element LD may be connected to the first power line VDD via the pixel circuit PXC, and the other end (e.g., an N-type semiconductor) of the light emitting element LD may be connected to the second power line VSS.

In some embodiments, the light emitting element LD may emit, when driving current is supplied thereto through the pixel circuit PXC, light having a luminance corresponding to the driving current.

In some embodiments, light emitting elements LD may be connected to each other by various connection structures between the first power line VDD and the second power line VSS. For example, the light emitting elements LD may be connected only in parallel to each other, or connected only in series to each other. In other words, the light emitting elements LD may be connected to each other in a serial/parallel combination structure.

The first power line VDD and the second power line VSS may have different potentials to allow the light emitting elements LD to emit light. The first power line VDD and the second power line VSS may have a potential difference that is sufficient to enable light to be emitted during an emission period of the sub-pixel SPXL. For example, the first power line VDD may be set to a potential that is higher than that of the second power line VSS.

The pixel circuit PXC may connect the first power line VDD with the light emitting element LD. The pixel circuit PXC may include a first transistor T1, a second transistor T2, a third transistor T3, and a storage capacitor CST.

In some embodiments, a first electrode of the first transistor T1 may be connected to the first power line VDD, and a second electrode thereof may be connected to one electrode (e.g., an anode electrode) of the light emitting element LD. A gate electrode of the first transistor T1 may be connected to a first node N1. The first transistor T1 may control, in response to a voltage applied thereto through the first node N1, current to be supplied to the light emitting element LD.

In some embodiments, a first electrode of the second transistor T2 may be connected to a data line DL, and a second electrode thereof may be connected to the first node N1. A gate electrode of the second transistor T2 may be connected to a scan line SL. When a scan signal is supplied from the scan line SL, the second transistor T2 may be turned on so that a data signal provided from the data line DL may be transmitted to the first node N1.

In some embodiments, a first electrode of the third transistor T3 may be connected to a sensing line SENL, and a second electrode thereof may be connected to a second node N2. A gate electrode of the third transistor T3 may be connected to a sensing signal line SEL. In case that the third transistor T3 is turned on in response to a sensing signal provided from the sensing signal line SEL, a reference voltage may be provided to the second node N2 through the sensing line SENL.

In some embodiments, the reference voltage may function to initialize or set a voltage of the electrode of the first transistor T1 (e.g., the source electrode of the first transistor T1) connected to the light emitting element LD to a corresponding value (e.g., a predetermined value). For example, the reference voltage may be set to a voltage that is equal to or less than the voltage of the second power line VSS.

In some embodiments, in case that the third transistor T3 is turned in response to a sensing signal provided from the sensing signal line SEL, sensing current may be transmitted to the sensing line SENL.

In some embodiments, the sensing current may be used to calculate changes in mobility and threshold voltage of the first transistor T1.

The storage capacitor CST may be connected between the first node N1 (or the gate electrode of the first transistor T1) and the second node N2 (or the second electrode of the first transistor T1). The storage capacitor CST may store information about a difference in voltage between the first node N1 and the second node N2.

The structure of the pixel circuit PXC is not limited to the structure illustrated in FIG. 4, and may be implemented in various forms. Furthermore, although FIG. 4 illustrates that the first to third transistors T1 to T3 each is formed of an N-type transistor, the present disclosure is not limited thereto. In some embodiments, the first to third transistors T1 to T3 each may be formed of a P-type transistor.

Hereinafter, descriptions will be focused on a structure of electrodes of the display device DD in accordance with some embodiments. However, before descriptions of the electrodes of the display device DD, a stacked structure defined in the display device DD will first be described.

FIG. 5 is a sectional view for describing a stacked structure included in the display device in accordance with some embodiments.

Referring to FIG. 5, the stacked structure included in the display device in accordance with some embodiments may be provided in the form of a structure formed by successively stacking a substrate SUB, a barrier electrode layer BML, a buffer layer BFL, an active layer ACT, a gate insulating layer GI, a gate electrode layer GE, a first interlayer insulating layer ILD1, a source/drain electrode layer SDL, a second interlayer insulating layer ILD2, a passivation layer PSV, an alignment electrode layer ELT, a first contact electrode layer CNE1, and a second contact electrode layer CNE2 are successively stacked and then patterning at least a portion thereof.

The substrate SUB may form a base of the display device DD, and may refer to a rigid or flexible substrate or film.

The buffer layer BFL may refer to a layer for reducing or preventing impurities from being diffused into the active layer ACT including a semiconductor, or for reducing or preventing moisture transmission. In some embodiments, the buffer layer BFL may include at least one of silicon nitride ($SiN_x$), silicon oxide ($SiO_x$), silicon oxynitride ($SiO_xN_y$), and metal oxide such as aluminum oxide ($AlO_x$).

The active layer ACT may be a layer including a semiconductor. For example, the active layer ACT may include at least one of polysilicon, low temperature polycrystalline silicon (LTPS), amorphous silicon, and an oxide semiconductor. In some embodiments, the active layer ACT may form channels of the first to third transistors T1 to T3, and a portion thereof that contacts the source/drain electrode layer SDL may be doped with an impurity.

The barrier electrode layer BML, the gate electrode layer GE, the source/drain electrode layer SDL, the alignment electrode layer ELT, the first contact electrode layer CNE1, and the second contact electrode layer CNE2 each may be a layer including conductive material.

In some embodiments, the barrier electrode layer BML, the gate electrode layer GE, and the source/drain electrode SDL each may have a single-layer structure or a multi-layer structure. In some embodiments, the barrier electrode layer BML, the gate electrode layer GE, and the source/drain electrode layer SDL each may include any one of gold (Au), silver (Ag), aluminum (Al), molybdenum (Mo), chrome (Cr), titanium (Ti), nickel (Ni), neodymium (Nd), copper (Cu), and platinum (Pt). However, the present disclosure is not limited thereto.

To electrically separate the active layer ACT, the gate electrode layer GE, the source/drain electrode layer SDL, and the alignment electrode layer ELT from each other, the gate insulating layer GI, the first interlayer insulating layer ILD1, the second interlayer insulating layer ILD2, and the passivation layer PSV may be interposed between the respective layers. In some embodiments, desired electrode patterns may be electrically connected to each other through a contact hole (e.g., a contact portion CNT) formed in any one of the gate insulating layer GI, the first interlayer insulating layer ILD1, the second interlayer insulating layer ILD2, and the passivation layer PSV.

In some embodiments, the gate insulating layer GI, the first interlayer insulating layer ILD1, the second interlayer insulating layer ILD2, and the passivation layer PSV each may include at least one of silicon nitride ($SiN_x$), silicon oxide ($SiO_x$), silicon oxynitride ($SiO_xN_y$), and aluminum oxide ($AlO_x$). In some embodiments, the gate insulating layer GI, the first interlayer insulating layer ILD1, the second interlayer insulating layer ILD2, and the passivation layer PSV each may include organic material, and be formed of a single layer or a plurality of layers.

In some embodiments, the alignment electrode layer ELT may include conductive material. For example, the alignment electrode layer ELT may include one of molybdenum (Mo), magnesium (Mg), silver (Ag), platinum (Pt), gold (Au), nickel (Ni), neodymium (Nd), iridium (Ir), chrome (Cr), titanium (Ti), copper (Cu), and/or aluminum (Al). However, the present disclosure is not limited to the foregoing example.

Insulating layers may be respectively interposed between the alignment electrode layer ELT, the first contact electrode layer CNE1, and the second contact electrode layer CNE2 so that the layers may be electrically separated/insulated from each other. For example, the first contact electrode layer CNE1 and the second contact electrode layer CNE2 may be separated from the alignment electrode layer ELT by a first insulating layer (refer to "INS1" of FIG. 12). The first contact electrode layer CNE1 and the second contact electrode layer CNE2 may be separated from each other by a third insulating layer (refer to "INS3" of FIG. 12).

Hereinafter, the display device DD in accordance with some embodiments will be described with reference to FIGS. 6 to 8, centered on electrodes provided in the display device DD.

Figure 6:
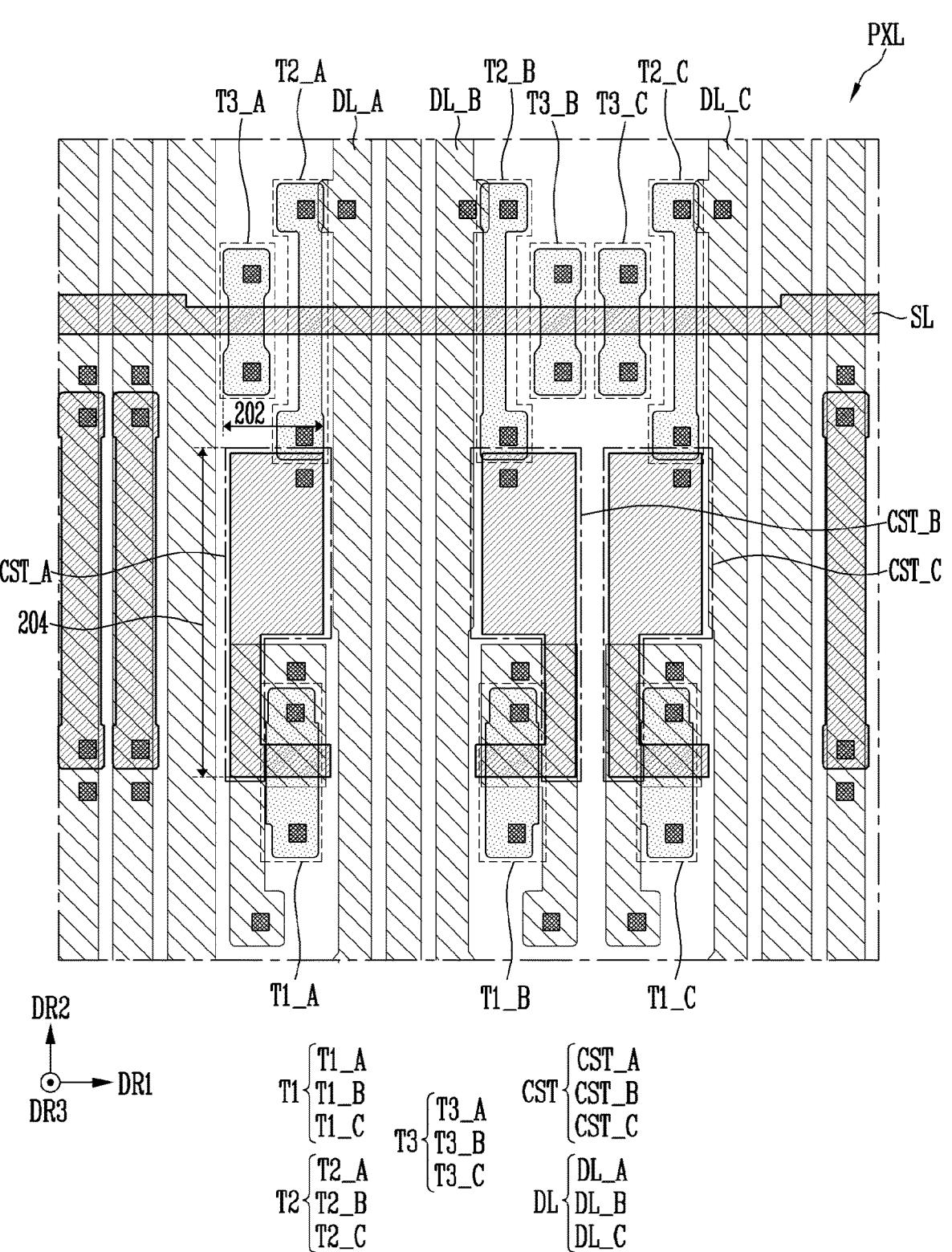
FIGS. 6 to 8 are layout views illustrating electrodes included in a pixel in accordance with some embodiments.
Figure 7:
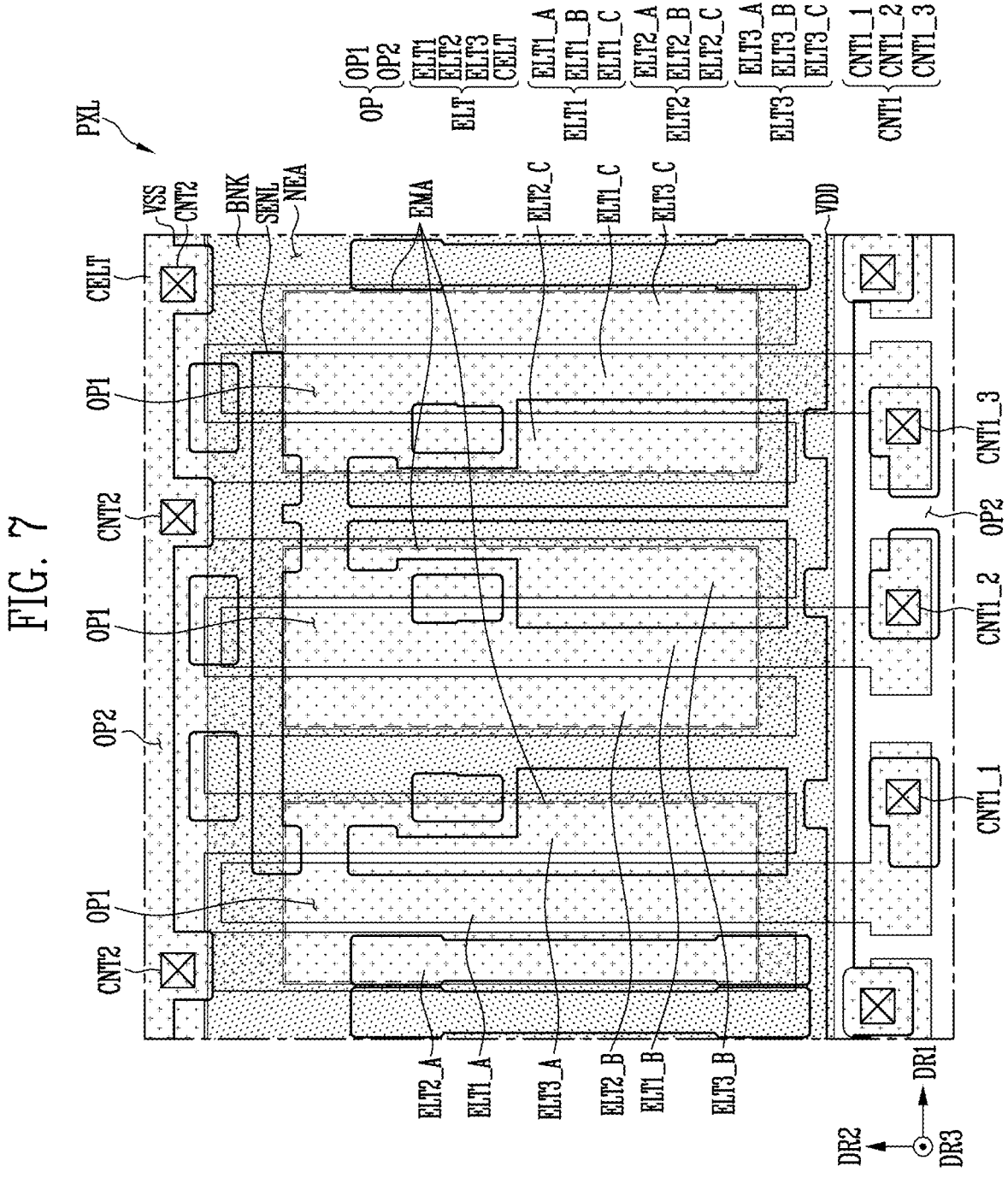
Figure 8:
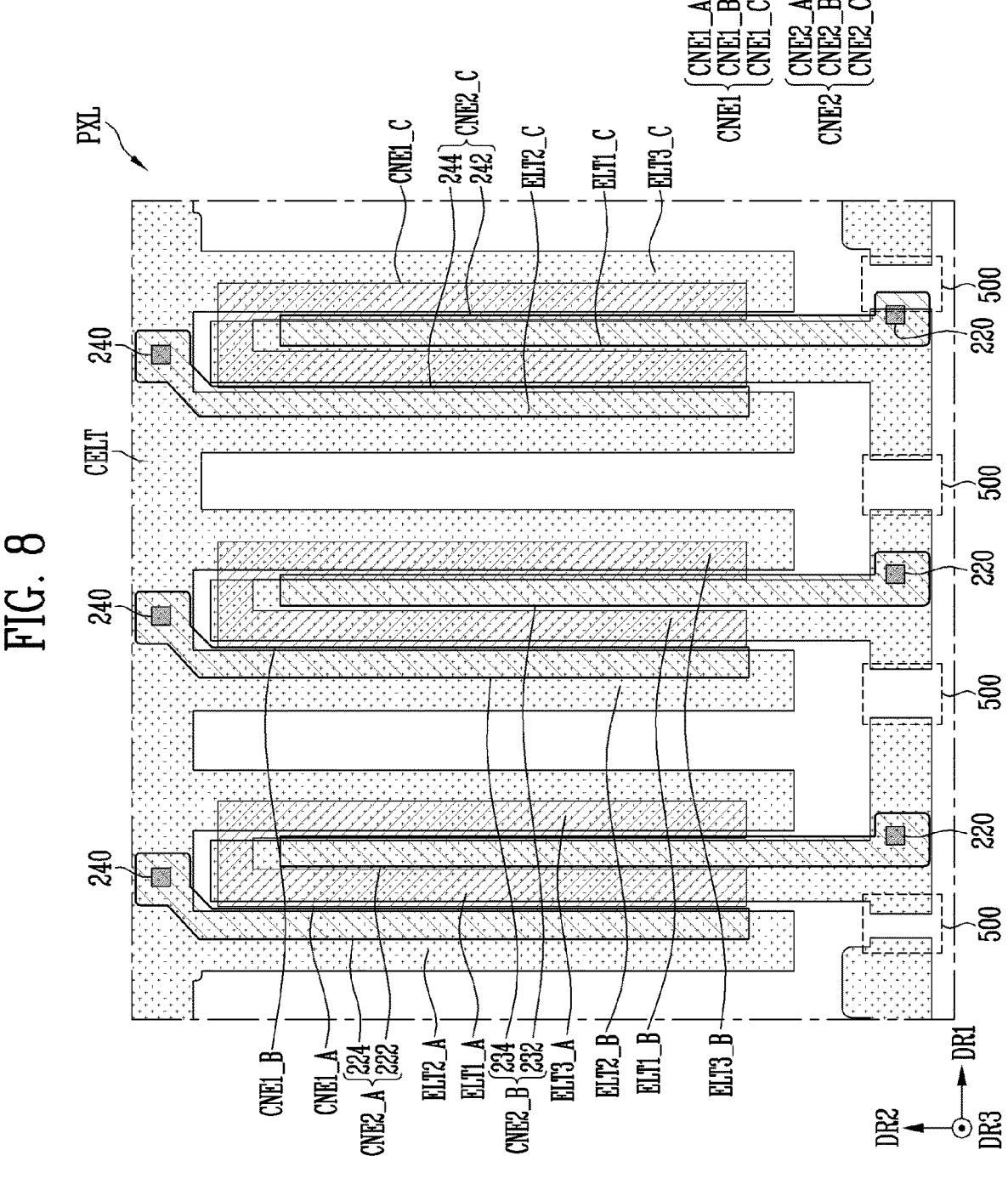

FIGS. 6 to 8 are layout views illustrating electrodes included in the pixel PXL in accordance with some embodiments.

FIGS. 6 to 8 illustrate the electrodes of the pixel PXL. FIGS. 6 to 8 illustrate different layers located in an identical area (e.g., in a plan view).

FIG. 6 illustrates the barrier electrode layer BML, the active layer ACT, and the gate electrode layer GE that have been described with reference to FIG. 5. In FIG. 6, contact holes used to electrically connect different electrode patterns to each other are represented in a square shape.

FIG. 7 illustrates the source/drain electrode layer SDL and the alignment electrode layer ELT that are described above with reference to FIG. 5. FIG. 7 further illustrates a bank BNK in accordance with some embodiments. In FIG. 7, the source/drain electrode layer SDL is indicated by a thick solid line. Furthermore, contact portions CNT1 and CNT2 configured to electrically connect different electrode patterns to each other are indicated by X-marked boxes.

FIG. 8 illustrates the alignment electrode layer ELT, the first contact electrode layer CNE1, and the second contact electrode layer CNE2 that have been described with reference to FIG. 5. In FIG. 8, contact components 220 and 240 used to electrically connect different electrode patterns to each other are represented in a square shape.

In some embodiments, the first to third transistors T1 to T3, the storage capacitor CST, data lines DL, the scan line SL, the sensing line SENL, the first power line VDD, and the second power line VSS may be included and located in the pixel PXL.

As described above with reference to FIG. 4, the first to third transistors T1 to T3 and the storage capacitor CST may form one pixel circuit PXC. In FIG. 6, there is illustrated a structure in which the first to third transistors T1 to T3 and the storage capacitor CST form three different pixel circuits PXC.

The first transistor T1 may include a 1_A-th transistor T1_A, a 1_B-th transistor T1_B, and a 1_C-th transistor T1_C. Here, the 1_A-th transistor T1_A may refer to the first transistor T1 included in the pixel circuit PXC of the first sub-pixel SPXL1. The 1_B-th transistor T1_B may refer to the first transistor T1 included in the pixel circuit PXC of the second sub-pixel SPXL2. The 1_C-th transistor T1_C may refer to the first transistor T1 included in the pixel circuit PXC of the third sub-pixel SPXL3.

The second transistor T2 may include a 2_A-th transistor T2_A, a 2_B-th transistor T2_B, and a 2_C-th transistor T2_C. Here, the 2_A-th transistor T2_A may refer to the second transistor T2 included in the pixel circuit PXC of the first sub-pixel SPXL1. The 2_B-th transistor T2_B may refer to the second transistor T2 included in the pixel circuit PXC of the second sub-pixel SPXL2. The 2_C-th transistor T2_C may refer to the second transistor T2 included in the pixel circuit PXC of the third sub-pixel SPXL3.

The third transistor T3 may include a 3_A-th transistor T3_A, a 3_B-th transistor T 3_B, and a 3_C-th transistor T3_C. Here, the 3_A-th transistor T3_A may refer to the third transistor T3 included in the pixel circuit PXC of the first sub-pixel SPXL1. The 3_B-th transistor T3_B may refer to the third transistor T3 included in the pixel circuit PXC of the second sub-pixel SPXL2. The 3_C-th transistor T3_C may refer to the third transistor T3 included in the pixel circuit PXC of the third sub-pixel SPXL3.

The storage capacitor CST may include a first storage capacitor CST_A, a second storage capacitor CST_B, and a third storage capacitor CST_C.

The first storage capacitor CST_A may refer to a storage capacitor CST included in the pixel circuit PXC of the first sub-pixel SPXL1. The second storage capacitor CST_B may refer to a storage capacitor CST included in the pixel circuit PXC of the second sub-pixel SPXL2. The third storage capacitor CST_C may refer to a storage capacitor CST included in the pixel circuit PXC of the third sub-pixel SPXL3.

In some embodiments, the first to third storage capacitors CST_A, CST_B, and CST_C may be successively located in the first direction DR1.

For example, the first storage capacitor CST_A may be spaced apart from the second and third storage capacitors CST_B and CST_C in the first direction DR1. The second storage capacitor CST_B may be spaced apart from the first and third storage capacitors CST_A and CST_C in the first direction DR1. The third storage capacitor CST_C may be spaced apart from the first and second storage capacitors CSTA and CSTB in the first direction DR1.

Here, the first direction DR1 may refer to a direction in which the first to third sub-pixels SPXL1, SPXL2, and SPXL3 are successively arranged. In this case, the direction in which the first to third sub-pixels SPXL1, SPXL2, and SPXL3 are arranged may be the same as the direction in which the first to third storage capacitors CSTA, CST_B, and CST_C are arranged.

In some embodiments, the first to third storage capacitors CSTA, CST_B, and CSTC may extend in a direction (e.g., the second direction DR2) that intersects the arrangement direction (e.g., the first direction DR1) in which the first to third sub-pixels SPXL1, SPXL2, and SPXL3 are arranged.

In some embodiments, the first to third storage capacitors CST_A, CST_B, and CST_C each may generally have a shape extending in the second direction DR2. For example, a maximum length or width of each of the first to third storage capacitors CST_A, CST_B, and CST_C with respect to the first direction DR1 may be less than a maximum length thereof with respect to the second direction DR2.

For example, a first maximum length or width 202 of each of the first to third storage capacitors CST_A, CST_B, and CST_C with respect to the first direction DR1 may be less than a second maximum length 204 of each of the first to third storage capacitors CST_A, CST_B, and CST_C with respect to the second direction DR2.

The scan line SL may extend in the first direction DR1. In some embodiments, the scan line SL of the pixel PXL may be spaced apart from the first to third storage capacitors CST_A, CST_B, and CST_C in the second direction DR2.

The data lines DL may include a first data line DL_A, a second data line DL_B, and a third data line DL_C. Here, the first data line DL_A may refer to the data line DL included in the pixel circuit PXC of the first sub-pixel SPXL1. The second data line DL_B may refer to the data line DL included in the pixel circuit PXC of the second sub-pixel SPXL2. The third data line DL_C may refer to the data line DL included in the pixel circuit PXC of the third sub-pixel SPXL3.

In some embodiments, the data lines DL may extend in the second direction DR2. The data lines DL may be spaced apart from each other in the first direction DR1. For example, the data lines DL may extend in a direction identical with the direction in which the first to third storage capacitors CST_A, CST_B, and CST_C extend. The data lines DL may extend in a direction intersecting the direction in which the first to third sub-pixels SPXL1, SPXL2, and SPXL3 are spaced apart from each other.

Referring to FIG. 7, in some embodiments, the sensing lines SENL may extend in the first direction DR1. The sensing line SENL may extend in a direction (e.g., the first direction DR1) intersecting the direction (e.g., the second direction DR2) in which the first to third storage capacitors CST_A, CST_B, and CST_C extend. The sensing line SENL may extend in a direction identical with the direction in which the first to third sub-pixels SPXL1, SPXL2, and SPXL3 are spaced apart from each other.

In some embodiments, the alignment electrode layer ELT may include first to third electrodes ELT1, ELT2, and ELT3 and a common connection electrode CELT. The first electrode ELT1 may include a 1_A-th electrode ELT1_A, a 1_B-th electrode ELT1_B, and a 1_C-th electrode ELT1_C. The second electrode ELT2 may include a 2_A-th electrode ELT2_A, a 2_B-th electrode ELT2_B, and a 2_C-th electrode ELT2_C. The third electrode ELT2 may include a 3_A-th electrode ELT3_A, a 3_B-th electrode ELT 3_B, and a 3_C-th electrode ELT3_C.

In some embodiments, the 1_A-th electrode ELT1_A, the 2_A-th electrode ELT2_A, and the 3_A-th electrode ELT3_A may be alignment electrodes of the first sub-pixel SPXL1. For example, the light emitting elements LD of the first sub-pixel SPXL1 may be located in an area in which the first sub-pixel SPXL1 is to be formed, based on electrical signals that are respectively provided to the 1_A-th electrode ELT1_A, the 2_A-th electrode ELT2_A, and the 3_A-th electrode ELT3_A.

In some embodiments, the 1_B-th electrode ELT1_B, the 2_B-th electrode ELT2_B, and the 3_B-th electrode ELT 3_B may be alignment electrodes of the second sub-pixel SPXL2. For example, the light emitting elements LD of the second sub-pixel SPXL2 may be located in an area in which the second sub-pixel SPXL2 is to be formed, based on electrical signals that are respectively provided to the 1_B-th electrode ELT1_B, the 2_B-th electrode ELT2_B, and the 3_B-th electrode ELT 3_B.

In some embodiments, the 1_C-th electrode ELT1_C, the 2_C-th electrode ELT2_C, and the 3_C-th electrode ELT3_C may be alignment electrodes of the third sub-pixel SPXL3. For example, the light emitting elements LD of the third sub-pixel SPXL3 may be located in an area in which the third sub-pixel SPXL3 is to be formed, based on electrical signals that are respectively provided to the 1_C-th electrode ELT1_C, the 2_C-th electrode ELT2_C, and the 3_C-th electrode ELT3_C.

Referring to FIG. 8, in some embodiments, the pixel PXL may include an open area 500. The open area 500 may refer to an area spaced apart between alignment electrode layers ELT to which anode signals are to be provided. For example, the open area 500 may refer to an area between the 1_A electrode ELT1_A and the 1_B electrode ELT1_B. The open area 500 may refer to an area between the 1_B electrode ELT1_B and the 1_C electrode ELT1_C. The open area 500 may be provided by depositing the alignment electrode layers ELT on an overall surface, and then by etching electrodes provided at a position at which the open area 500 is to be provided. As the open area 500 is provided, electrode components to which anode signals are to be supplied may be electrically divided from each other, so that the first to third sub-pixels SPXL1, SPXL2, and SPXL3 may be individually driven.

In some embodiments, the first contact portion CNT1 may include a 1_1-th contact portion CNT1_1, a 1_2-th contact portion CNT1_2, and a 1_3-th contact portion CNT1_3. The 1_1-th contact portion CNT1_1, the 1_2-th contact portion CNT1_2, and the 1_3-th contact portion CNT1_3 may be spaced apart from each other with the open area 500 provided therebetween.

In some embodiments, the electrode components of the source/drain electrode SDL may be provided in a mesh structure so as to form an electrode path through which an electrical signal is provided. For example, the first power line VDD included in the source/drain electrode layer SDL may extend in the first direction DR1. At least a portion of the source/drain electrode layer SDL may have a shape extending in the second direction DR2.

The first power line VDD may be electrically connected to the first electrode ELT1 through the first contact portion CNT1. The first power line VDD may provide an electrical signal (e.g., an anode signal) to the first electrode ELT1 through the first contact portion CNT1.

For example, a portion of the first power line VDD may be electrically connected to the 1_A-th electrode ELT1_A through the first contact portion CNT1_1. A portion of the first power line VDD may be electrically connected to the 1_B-th electrode ELT1_B through the first contact portion CNT1_2. A portion of the first power line VDD may be electrically connected to the 1_C-th electrode ELT1_C through the first contact portion CNT1_3.

The second power line VSS may be electrically connected to the common connection electrode CELT through the second contact portion CNT2. The second power line VSS may provide an electrical signal (e.g., a cathode signal) to the common connection electrode CELT through the second contact portion CNT2. In some embodiments, the common connection electrode CELT may be electrically connected to the second electrode ELT2 and the third electrode ELT3. Hence, the second power line VSS may provide an electrical signal (e.g., a cathode signal) to the second electrode ELT2 and the third electrode ELT3.

For example, the second power line VSS may provide electrical signals to the 2_A-th electrode ELT2_A, the 2_B-th electrode ELT2_B, and the 2_C-th electrode ELT2_C through the contact portion CNT2 and the common connection electrode CELT. The second power line VSS may provide electrical signals to the 3_A-th electrode ELT3_A, the 3_B-th electrode ELT 3_B, and the 3_C-th electrode ELT3_C through the contact portion CNT2 and the common connection electrode CELT.

The first power line VDD and the second power line VSS may extend in the first direction DR1. For example, the first power line VDD and the second power line VSS may extend in a direction that crosses the direction in which the first to third storage capacitors CST_A, CST_B, and CST_C extend. The first power line VDD and the second power line VSS may extend in the direction in which the first to third sub-pixels SPXL1, SPXL2, and SPXL3 are spaced apart from each other.

In some embodiments, the first power line VDD that extends in the first direction DR1 may be located between the first contact portions CNT1 and the first to third storage capacitors CST_A, CST_B, and CST_C.

For example, the first power line VDD may be located between the first storage capacitor CST_A and the 1_1-th contact portion CNT1_1. The first power line VDD may be located between the second storage capacitor CST_B and the 1_2-th contact portion CNT1_2. The first power line VDD may be located between the third storage capacitor CST_C and the 1_3-th contact portion CNT1_3.

Here, the 1_A-th transistor T1_A of the first sub-pixel SPXL1 may be electrically connected to the 1_A-th electrode ELT1_A through the 1_1-th contact portion CNT1_1. The 1_B-th transistor T1_B of the second sub-pixel SPXL2 may be electrically connected to the 1_B-th electrode ELT1_B through the 1_2-th contact portion CNT1_2. The 1_C-th transistor T1_C of the third sub-pixel SPXL3 may be electrically connected to the 1_C-th electrode ELT1_C through the 1_3-th contact portion CNT1_3.

In some embodiments, a plurality of first contact portions CNT1 may be provided and successively arranged in the first direction DR1.

In some embodiments, in a plan view, the 1_1-th contact portion CNT1_1, the 1_2-th contact portion CNT1_2, and the 1_3-th contact portion CNT1_3 may not overlap the first power line VDD. For example, the 1_1-th contact portion CNT1_1, the 1_2-th contact portion CNT1_2, and the 1_3-th contact portion CNT1_3 may not overlap the first power line VDD, and may be electrically connected to an electrode pattern formed on the source-drain electrode layer SDL. The electrode pattern may be electrically connected to the first power line VDD through a contact hole (e.g., a predetermined contact hole). Hence, the 1_1-th contact portion CNT1_1, the 1_2-th contact portion CNT1_2, and the 1_3-th contact portion CNT1_3 may be located at positions spaced apart from each other in a perimeter of an area in which the light emitting element LD is located. The area in which the light emitting element LD is located may have a sufficient large surface area.

However, the present disclosure is not limited to the foregoing example. In some embodiments, each of the first contact portions CNT1 may overlap the first power line VDD, in a plan view. In some embodiments, in a plan view, any one of the first contact portions CNT1 may overlap the 1_A-th electrode ELT1_A, and another one may overlap the 1_B-th electrode ELT1_B, and the other one may overlap the 1_C-th electrode ELT1_C.

In some embodiments, the direction (e.g., the first direction DR1) in which the 1_1-th contact portion CNT1_1, the 1_2-th contact portion CNT1_2, and the 1_3-th contact portion CNT1_3 are arranged may be substantially parallel to, or identical with, the direction in which the first power line VDD extends.

A plurality of second contact portions CNT2 may be provided and successively arranged in the first direction DR1. Each of the second contact portion CNT2 may overlap the second power line VSS, in a plan view. In some embodiments, in a plan view, the second contact portions CNT2 may overlap the common connection electrode CELT.

In some embodiments, the first contact portion CNT1 and the second contact portion CNT2 may be located in the second opening OP2 defined by the bank BNK.

In some embodiments, the storage capacitors CST may be located between a line on which the first contact portions CNT1 are arranged and a line on which the second contact portions CNT2 are arranged. Detailed description thereof will be made below with reference to FIG. 11.

The bank BNK may be arranged in a pattern (e.g., a predetermined pattern), and may define the emission area EMA and the non-emission area NEA. The bank BNK may include organic material or the inorganic material, but is not limited to a specific example.

In some embodiments, the emission area EMA may be an area in which the bank BNK is not located, and may refer to an area in which the light emitting element LD is located, and from which light is emitted. The non-emission area NEA may refer to an area in which the bank BNK is located. For example, the bank BNK and the emission area EMA may not overlap each other, in a plan view. The bank BNK and the non-emission area NEA may overlap each other, in a plan view.

The bank BNK may have a shape protruding in a display direction (e.g., the third direction DR3) of the display device DD, and may form an opening OP.

In some embodiments, the opening OP may include a first opening OP1 and a second opening OP2. The first opening OP1 may be an area in which the bank BNK is not located, and may include the area in which the light emitting element LD is located. The second opening OP2 may be an area in which the bank BNK is not located, and may include an area in which the light emitting element LD is not located. The second opening OP2 may have a shape extending in the first direction DR1. In some embodiments, the first contact portion CNT1 and the second contact portion CNT2 may be located in the second opening OP2.

In some embodiments, the first opening OP1 may be formed to provide space configured to receive fluid when an inkjet process for delivering the light emitting element LD is performed. For example, after the bank BNK is formed, ink including light emitting elements LD and a solvent may be provided in the space defined by the bank BNK. Thereafter, the light emitting elements LD may be arranged by performing a process of forming an electric field.

In some embodiments, a plurality of first openings OP1 may be formed. The first openings OP1 may be respectively provided in the first to third sub-pixels SPXL1, SPXL2, and SPXL3. For example, any one of the first openings OP1 may form the emission area EMA of the first sub-pixel SPXL1. Another one of the first openings OP1 may form the emission area EMA of the second sub-pixel SPXL2. The other one of the first openings OP1 may form the emission area EMA of the third sub-pixel SPXL3. For example, in a plan view, the first opening OP1 may overlap the emission area EMA.

FIG. 8 illustrates a structure of the contact electrode layers CNE1 and CNE2, which form two line path areas in each of the first to third sub-pixels SPXL1, SPXL2, and SPXL3. However, in some embodiments, there may be provided a structure of the contact electrode layers CNE1 and CNE2 that form four line path areas in each of the first to third sub-pixels SPXL1, SPXL2, and SPXL3. Detailed description thereof will be made below with reference to FIGS. 9 and 10.

The first contact electrode layer CNE1 may be located on the alignment electrode layer ELT. In some embodiments, the first contact electrode layer CNE1 may include a 1_A-th contact electrode layer CNE1_A, a 1_B-th contact electrode layer CNE1_B, and a 1_C-th contact electrode layer CNE1_C.

The first contact electrode layer CNE1 may electrically connect each light emitting element LD to one of the alignment electrodes ELT, respectively.

For example, the 1_A-th contact electrode layer CNE1_A may electrically connect the 1_A-th electrode ELT1_A with the light emitting elements LD that are located on the 1_A-th electrode ELT1_A and the 2_A-th electrode ELT2_A, and may electrically connect the 3_A-th electrode ELT3_A with the light emitting elements LD that are located on the 1_A-th electrode ELT1_A and the 3_A-th electrode ELT3_A.

The 1_B-th contact electrode layer CNE1_B may electrically connect the 1_B-th electrode ELT1_B with the light emitting elements LD that are located on the 1_B-th electrode ELT1_B and the 2_B-th electrode ELT2_B, and may electrically connect the 3_B-th electrode ELT 3_B with the light emitting elements LD that are located on the 1_B-th electrode ELT1_B and the 3_B-th electrode ELT 3_B.

The 1_C-th contact electrode layer CNE1_C may electrically connect the 1_C-th electrode ELT1_C with the light emitting elements LD that are located on the 1_C-th electrode ELT1_C and the 2_C-th electrode ELT2_C, and may electrically connect the 3_C-th electrode ELT3_C with the light emitting elements LD that are located on the 1_C-th electrode ELT1_C and the 3_C-th electrode ELT3_C.

The second contact electrode layer CNE2 may be located on the alignment electrode layer ELT. The second contact electrode layer CNE2 may be located on the first contact electrode layer CNE1. The second contact electrode layer CNE2 may electrically connect each light emitting element LD to any one of the alignment electrodes ELT. The second contact electrode layer CNE2 may include a 2_A-th contact electrode layer CNE2_A, a 2_B-th contact electrode layer CNE2_B, and a 2_C-th contact electrode layer CNE2_C.

The second contact electrode layer CNE2 may electrically connect each light emitting element LD to any one of the alignment electrodes ELT.

In some embodiments, the 2_A-th contact electrode layer CNE2_A may include a first component 222 and a second component 224. The first component 222 and the second component 224 of the 2_A-th contact electrode layer CNE2_A may be formed (or provided) through an identical process and spaced apart from each other. Here, the first component 222 of the 2_A-th contact electrode layer CNE2_A may electrically connect the 1_A-th electrode ELT1_A with the light emitting elements LD that are located on the 1_A-th electrode ELT1_A and the 3_A-th electrode ELT3_A. The second component 224 of the 2_A-th contact electrode layer CNE2_A may electrically connect the 2_A-th electrode ELT2_A and the common connection electrode CELT with the light emitting elements LD that are located on the 1_A-th electrode ELT1_A and the 2_A-th electrode ELT2_A.

In some embodiments, the 2_B-th contact electrode layer CNE2_B may include a first component 232 and a second component 234. The first component 232 and the second component 234 of the 2_B-th contact electrode layer CNE2_B may be formed (or provided) through an identical process and spaced apart from each other. Here, the first component 232 of the 2_B-th contact electrode layer CNE2_B may electrically connect the 1_B-th electrode ELT1_B with the light emitting elements LD that are located on the 1_B-th electrode ELT1_B and the 3_B-th electrode ELT3_B. The second component 234 of the 2_B-th contact electrode layer CNE2_B may electrically connect the 2_B-th electrode ELT2_B and the common connection electrode CELT with the light emitting elements LD that are located on the 1_B-th electrode ELT1_B and the 2_B-th electrode ELT2_B.

In some embodiments, the 2_C-th contact electrode layer CNE2_C may include a first component 242 and a second component 244. The first component 242 and the second component 244 of the 2_C-th contact electrode layer CNE2_C may be formed (or provided) through an identical process and spaced apart from each other. The first component 242 of the 2_C-th contact electrode layer CNE2_C may electrically connect the 1_C-th electrode ELT1_C with the light emitting elements LD that are located on the 1_C-th electrode ELT1_C and the 3_C-th electrode ELT3_C. The second component 244 of the 2_C-th contact electrode layer CNE2_C may electrically connect the 2_C-th electrode ELT2_C and the common connection electrode CELT with the light emitting elements LD that are located on the 1_C-th electrode ELT1_C and the 2_C-th electrode ELT2_C.

In some embodiments, the second contact electrode layer CNE2 may be electrically connected to the alignment electrode layer ELT through the contact components 220 and 240.

For example, the first component 222 of the 2_A-th contact electrode layer CNE2_A may be electrically connected to the 1_A-th electrode ELT1_A by the first contact component 220. The second component 224 of the 2_A-th contact electrode layer CNE2_A may be electrically connected to the common connection electrode CELT by the second contact component 240.

The first component 232 of the 2_B-th contact electrode layer CNE2_B may be electrically connected to the 1_B-th electrode ELT1_B by the first contact component 220. The second component 234 of the 2_B-th contact electrode layer CNE2_B may be electrically connected to the common connection electrode CELT by the second contact component 240.

The first component 242 of the 2_C-th contact electrode layer CNE2_C may be electrically connected to the 1_C-th electrode ELT1_C by the first contact component 220. The second component 244 of the 2_C-th contact electrode layer CNE2_C may be electrically connected to the common connection electrode CELT by the second contact component 240.

Next, the arrangement structure of the light emitting elements LD in accordance with some embodiments will be described with reference to FIGS. 9 and 10. Descriptions which may be duplicated with that of the embodiments described above will be simplified or omitted.

Figure 9:
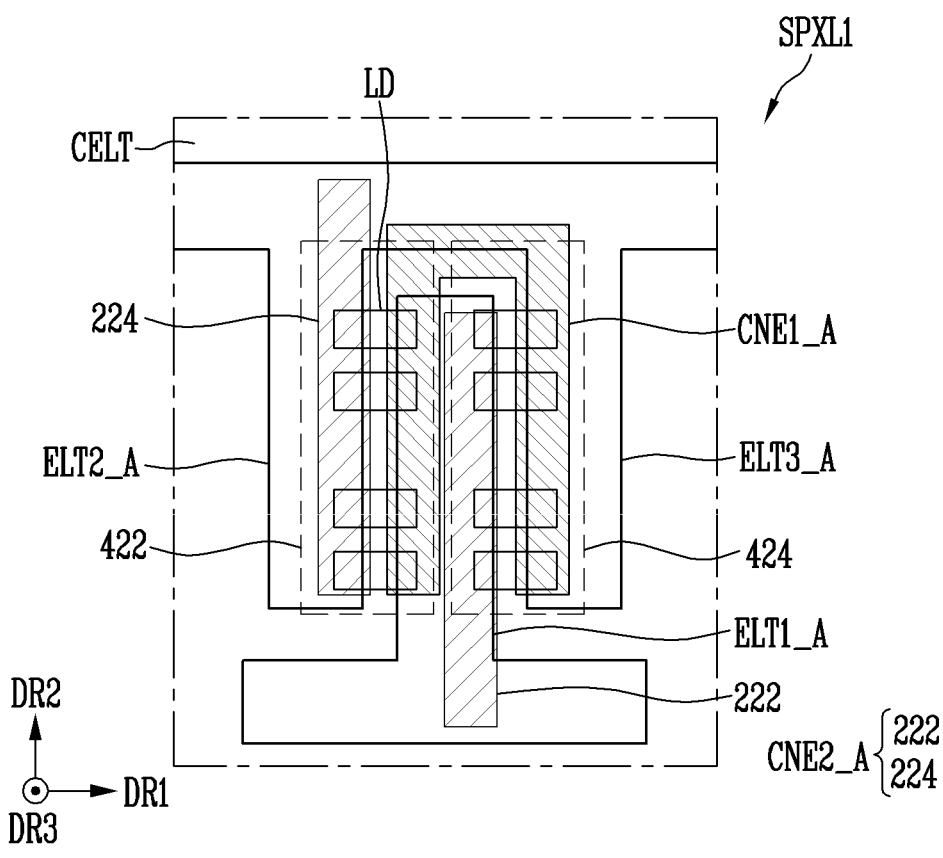
FIGS. 9 and 10 are plan views illustrating an arrangement structure of light emitting elements.
Figure 10:
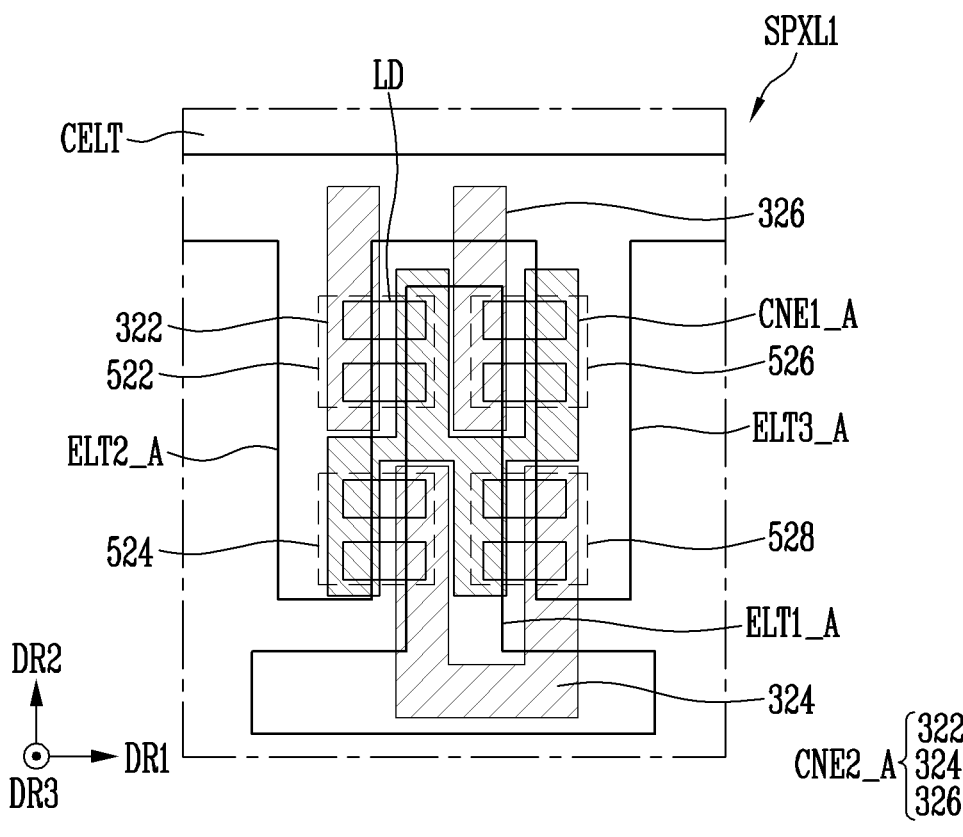

FIGS. 9 and 10 are plan views illustrating the arrangement structure of the light emitting elements. For the sake of explanation, the arrangement structure of the light emitting elements will be described based on the first sub-pixel SPXL1.

FIG. 9 is a plan view illustrating the first sub-pixel SPXL1 in accordance with some embodiments, and illustrates some embodiments in which two line path areas 422 and 424 are provided on three alignment electrodes ELT1_A, ELT2_A, and ELT3_A. A planar structure illustrated in FIG. 9 may be obtained by simplifying the structure described above with reference to FIG. 8.

Here, the line path areas 422 and 424 each may refer to an area in which the light emitting elements LD are arranged in one direction.

In some embodiments, the first sub-pixel SPXL1 may include a first line path area 422 and a second line path area 424.

In the first line path area 422, one end of each corresponding light emitting element LD may be electrically connected to the 1_A-th electrode ELT1_A by a portion of the 1_A-th contact electrode CNE1_A, and the other end of the light emitting element LD may be electrically connected to the 2_A-th electrode ELT2_A by the second component 224 of the 2_A-th contact electrode CNE2_A.

In the second line path area 424, one end of each corresponding light emitting element LD may be electrically connected to the 3_A-th electrode ELT3_A by another portion of the 1_A-th contact electrode CNE1_A, and the other end of the light emitting element LD may be electrically connected to the 1_A-th electrode ELT1_A by the first component 222 of the 2_A-th contact electrode CNE2_A.

FIG. 10 is a plan view illustrating the first sub-pixel SPXL1 in accordance with some embodiments, and illustrates some embodiments in which fourth line path areas 522, 524, 526, and 528 are provided on three alignment electrodes ELT1_A, ELT2_A, and ELT3_A. Here, the line path areas 522, 524, 526, and 528 each may refer to an area in which the light emitting elements LD are arranged in one direction.

In some embodiments, the first sub-pixel SPXL1 may include the first line path area 522, the second line path area 524, the third line path area 526, and the fourth line path area 528.

In the first line path area 522, one end of each corresponding light emitting element LD may be electrically connected to the 2_A-th electrode ELT2_A and the common connection electrode CELT by the first component 322 of the 2_A-th contact electrode CNE2_A, and the other end of the light emitting element LD may be electrically connected to the 1_A-th electrode ELT1_A by a portion of the 1_A-th contact electrode CNE1_A.

In the second line path area 524, one end of each corresponding light emitting element LD may be electrically connected to the 1_A-th electrode ELT1_A by the second component 324 of the 2_A-th contact electrode CNE2_A, and the other end of the light emitting element LD may be electrically connected to the 2_A-th electrode ELT2_A and the common connection electrode CELT by a portion of the 1_A-th contact electrode CNE1_A.

In the third line path area 526, one end of each corresponding light emitting element LD may be electrically connected to the 1_A-th electrode ELT1_A by the third component 326 of the 2_A-th contact electrode CNE2_A, and the other end of the light emitting element LD may be electrically connected to the 3_A-th electrode ELT3_A and the common connection electrode CELT by a portion of the 1_A-th contact electrode CNE1_A.

In the fourth line path area 528, one end of each corresponding light emitting element LD may be electrically connected to the 3_A-th electrode ELT3_A and the common connection electrode CELT by the second component 324 of the 2_A-th contact electrode CNE2_A, and the other end of the light emitting element LD may be electrically connected to the 1_A-th electrode ELT1_A by a portion of the 1_A-th contact electrode CNE1_A.

Experimentally, in case that the number of line path areas in the sub-pixel SPXL is increased, the luminance of the sub-pixel SPXL may be enhanced. For example, luminance efficiency of the sub-pixel SPXL in accordance with some embodiments described with reference to FIG. 10 may be higher than that of the sub-pixel SPXL in accordance with some embodiments described with reference to FIG. 9. However, due to the disposition of the electrode structure, it may be suitable to secure a line path having a sufficient length to provide the sub-pixel SPXL in accordance with some embodiments described above with reference to FIG. 10.

In some embodiments, due to the disposition relationship between the storage capacitor CST, the first contact portion CNT1, the second contact portion CNT2, and the first power line VDD, a sufficient line path length may be secured, so that a structure including a plurality line path areas may be easily provided. Hence, in some embodiments, the luminance of the sub-pixel SPXL may be further improved.

Hereinafter, the structure of the pixel PXL in accordance with some embodiments will be described in more detail with reference to FIGS. 11 to 14.

Figure 11:
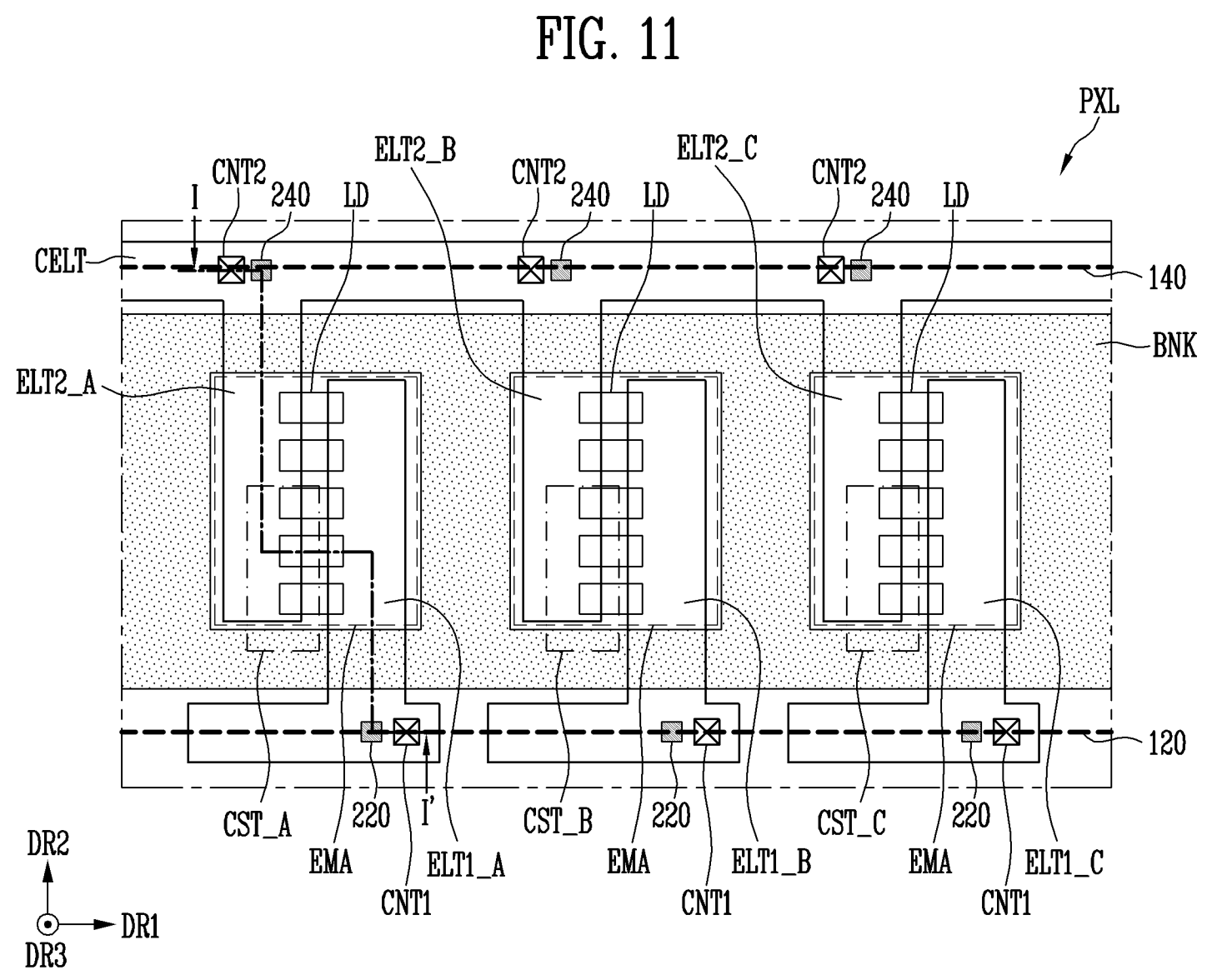

FIG. 11 is a plan view illustrating a pixel in accordance with some embodiments.

In some embodiments, the first contact portion CNT1 and the second contact portion CNT2 may be located more outside than the emission area EMA for each of the first to third sub-pixels SPXL1, SPXL2, and SPXL3. As the first contact portion CNT1 and the second contact portion CNT2 are located in an outer area, the area in which the light emitting elements LD may be located may be sufficiently secured. Structural characteristics pertaining thereto will be described below.

At least some of a plurality of first contact portions CNT1 provided may be located along a first line 120 extending in the first direction DR1. Here, the words "the first contact portions CNT1 are located along the first line 120" may mean that there is a tendency that the first contact portions CNT1 are schematically arranged in the first direction DR1.

At least some of a plurality of second contact portions CNT2 provided may be located along a second line 140 extending in the first direction DR1. Here, the words "the second contact portions CNT2 are located along the second line 140" may mean that there is a tendency that the second contact portions CNT2 are schematically arranged in the first direction DR1.

Here, the first line 120 and the second line 140 may be spaced apart from each other by a sufficient distance. Hence, with respect to the second direction DR2, a sufficient length of the area (e.g., the emission area EMA) in which the light emitting elements LD are arranged may be secured. In this case, a larger number of light emitting elements LD may be located in the emission area EMA, so that the emission performance of the pixel PXL may be enhanced.

In some embodiments, in a plan view, the first to third storage capacitors CST_A, CST_B, and CST_C may not overlap the first contact portion CNT1 and the second contact portion CNT2. The first to third storage capacitors CST_A, CST_B, and CST_C may be located between the first line 120, which may be imaginary, along which the first contact portions CNT1 are arranged, and the second line 140, which may be imaginary, along which the second contact portions CNT2 are arranged. In a plan view, the first line 120 and the second line 140 might not overlap the bank BNK.

In some embodiments, the direction in which the first line 120 and the second line 140 extend may intersect (or may be substantially perpendicular to) the direction in which the storage capacitors CST_A, CST_B, and CST_C extend.

In some embodiments, the direction in which the first line 120 and the second line 140 extend may be identical (or substantially parallel) with the direction in which the storage capacitors CST_A, CST_B, and CST_C are successively arranged.

In some embodiments, some of the first to third storage capacitors CST_A, CST_B, and CST_C may not overlap the bank BNK, in a plan view. For example, at least some of the first to third storage capacitors CST_A, CST_B, and CST_C may be located to overlap the emission area EMA in which the bank BNK is not located.

In some embodiments, as described above, the first to third storage capacitors CST_A, CST_B, and CST_C each may have a shape in which a length thereof in the second direction DR2 is greater than a length thereof in the first direction DR1. The first to third storage capacitors CST_A, CST_B, and CST_C may be successively located in the first direction DR1.

According to the foregoing structure, the emission area EMA in which the light emitting elements LD may be arranged may have a sufficiently large size.

Experimentally, in case that the first to third storage capacitors CST_A, CST_B, and CST_C each generally have a shape extending in the first direction DR1, the first contact portions CNT1 and the second contact portions CNT2 may be located adjacent to the area in which the light emitting elements LD are arranged, so as to avoid an otherwise unnecessary electrode structure to be formed. In other words, the distance between the first line 120 and the second line 140 may be reduced. In this case, the area in which the light emitting elements LD may be located may be reduced. In case that each first contact portion CNT1 and each second contact portions CNT2 are formed on the passivation layer PSV that is one of lower insulating layers, a groove may be formed in an adjacent area in which each of the first and second contact portions CNT1 and CNT2 is formed, so that there may be formed a step difference between the adjacent area and an area in which the first contact portions CNT1 and the second contact portions CNT2 are not formed. Hence, it may be suitable to locate the light emitting elements LD at positions spaced apart from the first contact portions CNT1 and the second contact portions CNT2.

However, in some embodiments, because each of the first to third storage capacitors CST_A, CST_B, and CST_C has a shape extending in the second direction DR2, which is a direction in which the first contact portions CNT1 and the second contact portions CNT2 are spaced apart from each other, the first contact portions CNT1 and the second contact portions CNT2 may be spaced apart from each other by a sufficient distance and located in the outer area. Therefore, a sufficiently large area in which the light emitting elements LD may be located may be secured.

In some embodiments, each first contact portion CNT1 may not overlap the bank BNK in a plan view. The first contact portion CNT1 may be spaced apart from the emission area EMA in the second direction DR2. The first contact portion CNT1 may be spaced apart from the bank BNK in the second direction DR2. Each second contact portion CNT2 might not overlap the bank BNK in a plan view. The second contact portion CNT2 may be spaced apart from the emission area EMA in the second direction DR2. The second contact portion CNT2 may be spaced apart from the bank BNK in the second direction DR2. Hence, the emission area EMA defined by the bank BNK may be sufficiently large.

Consequently, according to the present disclosure, the emission area EMA may be sufficiently large, so that the number of light emitting elements LD that may be located in the emission area EMA may be increased. In this case, power required to provide needed luminance may be reduced, so that heat generation and power consumption can be mitigated, whereby the emission efficiency can be improved.

Particularly, to provide the pixel PXL in accordance with some embodiments described above with reference to FIG. 10, there is a need to sufficiently increase the length of each line path in which the light emitting elements LD are located. In accordance with the present disclosure, because the length of the line path in which the light emitting elements LD are located may extend, the structure of the pixel PXL may be embodied such that a plurality of line path areas can be provided. Therefore, the luminance of the display device DD may be further improved.

Figure 12:
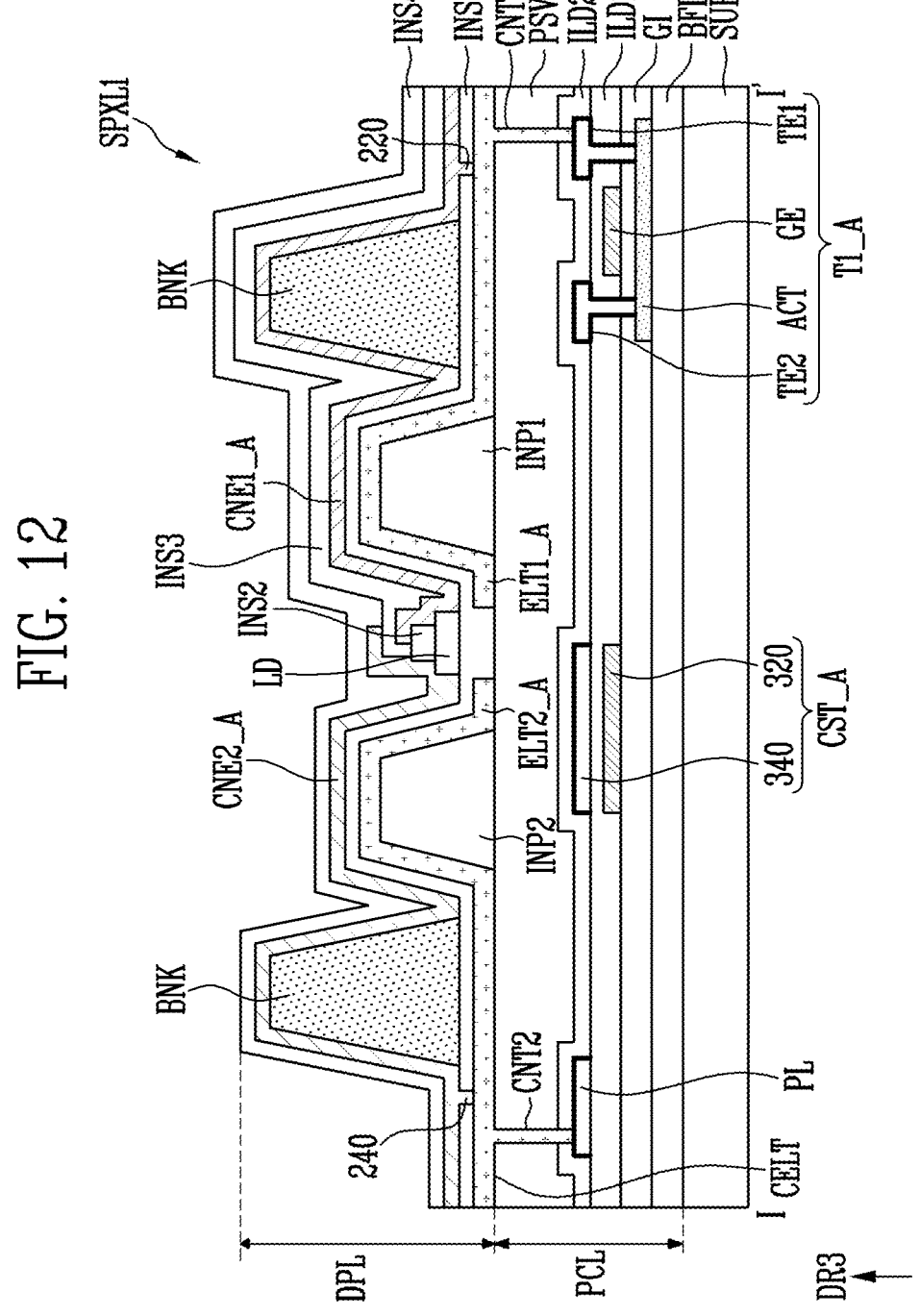
FIG. 12 is a sectional view taken along the line I-I' of FIG. 11.

FIG. 12 is a sectional view taken along the line I-I' of FIG. 11. FIG. 12 is a view illustrating a cross-sectional structure of the first sub-pixel SPXL in accordance with some embodiments. For the sake of explanation, the following description with reference to FIG. 12 will be made based on the first sub-pixel SPXL1 of the first to third sub-pixels SPXL1, SPXL2, and SPXL3. Technical characteristics described based on the first sub-pixel SPXL1 may be applied to the second and third sub-pixels SPXL2 and SPXL3 depending on embodiments. Descriptions that would be duplicated with those of the embodiments described above will be omitted or simplified.

Referring to FIG. 12, the first sub-pixel SPXL1 may include a substrate SUB, a pixel circuit layer PCL, and a display element layer DPL.

The substrate SUB may be provided as a base surface. The pixel circuit layer PCL and the display element layer DPL may be located on the substrate SUB.

The pixel circuit layer PCL may be located on the substrate SUB. The pixel circuit layer PCL may include a buffer layer BFL, a 1_A-th transistor T1_A, a gate insulating layer GI, a first interlayer insulating layer ILD1, a second interlayer insulating layer ILD2, a first storage capacitor CST_A, a power line PL, a passivation layer PSV, a first contact portion CNT1, and a second contact portion CNT2.

The buffer layer BFL may be located on the substrate SUB. The buffer layer BFL may reduce or prevent impurities otherwise diffusing from the outside.

The 1_A-th transistor T1_A may be a thin-film transistor. In some embodiments, the 1_A-th transistor T1_A may be a driving transistor.

The 1_A-th transistor T1_A may be electrically connected to the light emitting element LD. The 1_A-th transistor T1_A may be electrically connected to the 1_A-th electrode ELT1_A through the first contact portion CNT1.

The 1_A transistor T1_A may include an active layer ACT, a first transistor electrode TE1, a second transistor electrode TE2, and a gate electrode layer GE.

The active layer ACT may refer to a semiconductor layer. The active layer ACT may be located on the buffer layer BFL.

The active layer ACT may include a first contact area, which contacts the first transistor electrode TE1, and a second contact area, which contacts the second transistor electrode TE2. Each of the first contact area and the second contact area may be a semiconductor pattern doped with an impurity. An area between the first contact area and the second contact area may be a channel area. The channel area may be an intrinsic semiconductor pattern that is not doped with impurities.

The gate electrode layer GE may be located on the gate insulating layer GI. The position of the gate electrode layer GE may correspond to the position of the channel area of the active layer ACT. For example, the gate electrode layer GE may be located on the channel area of the active layer ACT with the gate insulating layer GI interposed therebetween.

The gate insulating layer GI may be located on the active layer ACT. The gate insulating layer GI may include inorganic material.

The first interlayer insulating layer ILD1 may be located on the gate electrode GE.

The first transistor electrode TE1 and the second transistor electrode TE2 may be located on the first interlayer insulating layer ILD1. The first transistor electrode TE1 may contact the first contact area of the active layer ACT through the gate insulating layer GI and the first interlayer insulating layer ILD1. The second transistor electrode TE2 may contact the second contact area of the active layer ACT through the gate insulating layer GI and the first interlayer insulating layer ILD1. For example, the first transistor electrode TE1 may be a drain electrode, and the second transistor electrode TE2 may be a source electrode, but the present disclosure is not limited thereto.

In some embodiments, the first transistor electrode TE1 and the second transistor electrode TE2 each may include conductive material. For example, the first transistor electrode TE1 and the second transistor electrode TE2 each may include metal such as molybdenum (Mo), magnesium (Mg), silver (Ag), platinum (Pt), palladium (Pd), gold (Au), nickel (Ni), neodymium (Nd), iridium (Ir), chrome (Cr), titanium (Ti), copper (Cu), aluminum (Al), and/or an alloy thereof. For instance, the first transistor electrode TE1 and the second transistor electrode TE2 each may have a multi-layer structure including titanium (Ti) and copper (Cu).

The second interlayer insulating layer ILD2 may be located on the first transistor electrode TE1 and the second transistor electrode TE2.

The first storage capacitor CST_A may include a first storage plate 320 and a second storage plate 340. The first storage plate 320 and the second storage plate 340 may face each other with the first interlayer insulating layer ILD1 interposed therebetween. The first storage plate 320 may be located on the gate insulating layer GI. The second storage plate 340 may be located on the first interlayer insulating layer ILD1.

The power line PL may be located on the first interlayer insulating layer ILD1. The power line PL may be electrically connected with the 2_A-th electrode ELT2_A through the second contact portion CNT2 and the common connection electrode CELT.

The passivation layer PSV may be located on the second interlayer insulating layer ILD2. In some embodiments, the first contact portion CNT1 connected with one area of the first transistor electrode TE1, and the second contact portion CNT2 connected with one area of the power line PL, may be formed on the passivation layer PSV. The first contact portion CNT1 and the second contact portion CNT2 each may pass through the passivation layer PSV and the second interlayer insulating layer ILD2.

The display element layer DPL may be located on the pixel circuit layer PCL. The display element layer DPL may include a first insulating pattern INP1, a second insulating pattern INP2, the bank BNK, the 1_A-th electrode ELT1_A, the 2_A-th electrode ELT2_A, the common connection electrode CELT, the first insulating layer INS1, the light emitting elements LD, a second insulating layer INS2, a second insulating layer INS2, the 1_A-th contact electrode CNE1_A, the third insulating layer INS3, the 2_A-th contact electrode CNE2_A, and a fourth insulating layer INS4.

The first insulating pattern INP1 and the second insulating pattern INP2 may protrude in a thickness-wise direction of the substrate SUB (e.g., in the third direction DR3). In a plan view, the first insulating pattern INP1 and the second insulating pattern INP2 may be arranged in a shape enclosing the area in which the light emitting elements LD are located. The first insulating pattern INP1 and the second insulating pattern INP2 each may include organic material or inorganic material.

The 1_A-th electrode ELT1_A may be located on the first insulating pattern INP1. The 2_A-th electrode ELT2_A may be located on the second insulating pattern INP2. The 1_A-th electrode ELT1_A and the 2_A-th electrode ELT2_A may reflect light provided from the light emitting elements LD in the display direction (e.g., the third direction DR3) of the display device DD. Hence, light efficiency of the first sub-pixel SPXL1 may be enhanced.

The bank BNK may be located on the first insulating layer INS1. The bank BNK may protrude in the thickness-wise direction of the substrate SUB. The area in which the light emitting elements LD are located may be provided between banks BNK.

The 1_A-th electrode ELT1_A may be provided on the passivation layer PSV. In some embodiments, a portion of the 1_A-th electrode ELT1_A may be located on the first insulating pattern INP1.

The 1_A-th electrode ELT1_A may electrically connect the 1_A-th transistor T1_A with the 1_A-th contact electrode CNE1_A. The 1_A-th electrode ELT1A may be electrically connected with the 1_A-th transistor T1_A through the first contact portion CNT1. For example, the 1_A-th electrode ELT1_A may provide an anode signal to the 1_A-th contact electrode CNE1_A.

The 2_A-th electrode ELT2_A may be provided on the passivation layer PSV. In some embodiments, a portion of the 2_A-th electrode ELT2_A may be located on the second insulating pattern INP2.

The 2_A-th electrode ELT2_A may be electrically connected to the power line PL by the common connection electrode CELT.

The common connection electrode CELT may be located on the passivation layer PSV. The common connection electrode CELT may be integrally formed with the 2_A-th electrode ELT2_A.

The common connection electrode CELT may provide an electrical signal (e.g., a cathode signal) to the 2_A-th contact electrode CNE2_A. The common connection electrode CELT may be electrically connected to the power line PL through the second contact portion CNT2. The common connection electrode CELT may electrically connect the power line PL to the 2_A-th electrode ELT2_A.

The first insulating layer INS1 may be located on the passivation layer PSV. The first insulating layer INS1 may cover the 1_A-th electrode ELT1_A and the 2_A-th electrode ELT2_A. The first insulating layer INS1 may stabilize connection between the electrode components and reduce external influence. The first insulating layer INS1 may include any one of silicon nitride (SiNx), silicon oxide (SiOx), silicon oxynitride (SiOxNy), and aluminum oxide (AlOx).

The light emitting elements LD may be located on the first insulating layer INS1. The light emitting elements LD1 each may emit light based on electrical signals provided from the 1_A-th contact electrode CNE1_A and the 2_A-th contact electrode CNE2_A.

In some embodiments, the light emitting elements LD may be arranged based on an electric field formed by electrical signals provided to the 1_A-th electrode ELT1_A and the 2_A-th electrode ELT2_A. For example, a first electrical signal may be provided to the 1_A-th electrode ELT1_A, and a second electrical signal may be provided to the 2_A-th electrode ELT2_A. The first electrical signal and the second electrical signal may form an electric field between the 1_A-th electrode ELT1_A and the 2_A-th electrode ELT2_A. The light emitting elements LD may be arranged by external force (e.g., dielectrophoretic (DEP) force) resulting from the electric field.

The second insulating layer INS2 may be located on the light emitting elements LD. The second insulating layer INS2 may cover the active layer AL of each of the light emitting elements LD. In some embodiments, the second insulating layer INS2 may include any one of organic material or inorganic material.

The 1_A-th contact electrode CNE1_A and the 2_A-th contact electrode CNE2_A may be located on the first insulating layer INS1. The 1_A-th contact electrode CNE1_A may be electrically connected to the 1_A-th electrode ELT1_A by the first contact component 220. The 1_A-th contact electrode CNE1_A may electrically connect the light emitting elements LD to the 1_A-th electrode ELT1_A. The 2_A-th contact electrode CNE2_A may be electrically connected to the common connection electrode CELT by the second contact component 240. The 2_A-th contact electrode CNE2_A may electrically connect the light emitting elements LD to the common connection electrode CELT.

The 1_A contact electrode CNE1_A and the 2_A contact electrode CNE2_A may include conductive material. For example, the 1_A contact electrode CNE1_A and the 2_A contact electrode CNE2_A may include transparent conductive material including indium tin oxide (ITO), indium zinc oxide (IZO), and indium tin zinc oxide (ITZO), but the present disclosure is not limited thereto.

The third insulating layer INS3 may be located on the 1_A-th contact electrode CNE1_A. At least a portion of the third insulating layer INS3 may be located between the 1_A-th contact electrode CNE1_A and the 2_A-th contact electrode CNE2_A, thus reducing or preventing the likelihood of a short circuit between the 1_A-th contact electrode CNE1_A and the 2_A-th contact electrode CNE2_A. In some embodiments, the third insulating layer INS3 may include at least one of silicon nitride ($SiN_x$), silicon oxide ($SiO_x$), silicon oxynitride ($SiO_xN_y$), and aluminum oxide ($AlO_x$).

The fourth insulating layer INS4 may be located in an outer portion of the display element layer DPL. The fourth insulating layer INS4 may protect the individual components of the display element layer DPL from external effects. In some embodiments, the fourth insulating layer INS4 may include at least one of silicon nitride ($SiN_x$), silicon oxide ($SiO_x$), silicon oxynitride ($SiO_xN_y$), and aluminum oxide ($AlO_x$).

The structure of the first sub-pixel SPXL1 is not limited to the foregoing examples. In some embodiments, the first sub-pixel SPXL1 may further include an additional component.

For example, a planarization layer may be further provided on the fourth insulating layer INS4. The planarization layer may mitigate a step difference formed by various components located thereunder. A top surface of the planarization layer may be generally planar. In some embodiments, the planarization layer include an organic insulating layer.

Hereinafter, layers located on the display element layer DPL of the pixel PXL in accordance with some embodiments will be described with reference to FIGS. 13 and 14.

Figure 13:
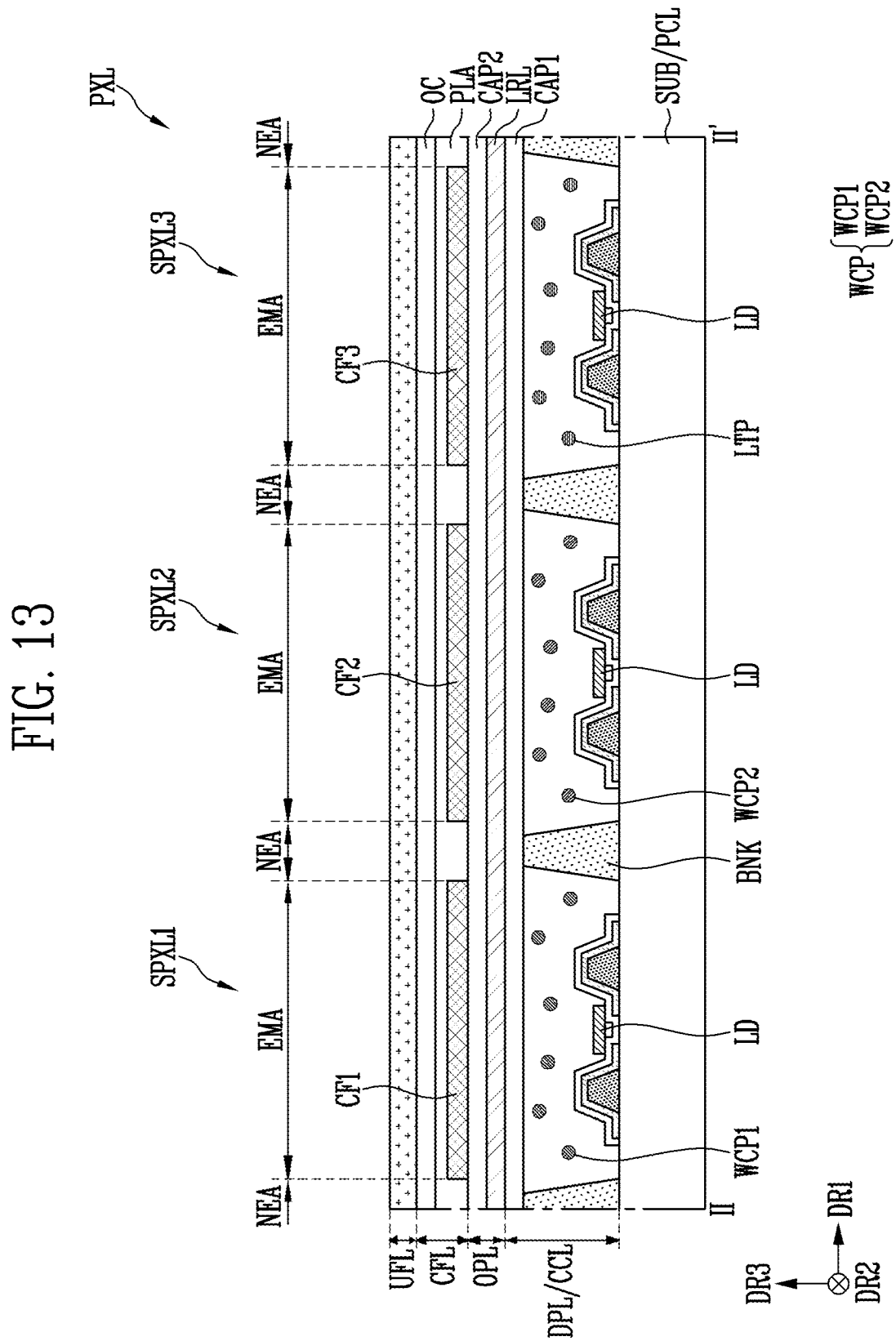
FIGS. 13 and 14 are sectional views taken along the line II-II' of FIG. 3.
Figure 14:
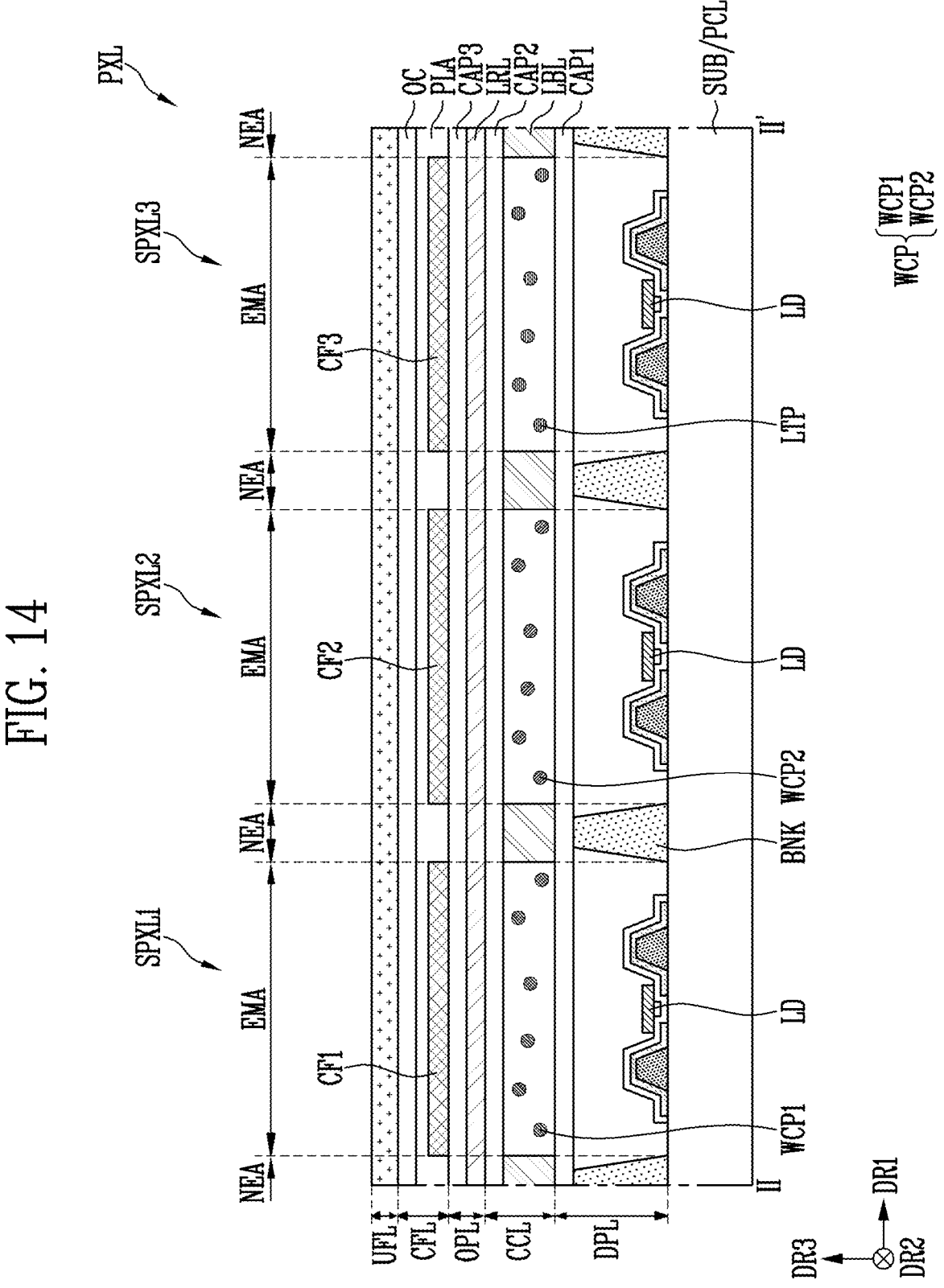

FIGS. 13 and 14 are sectional views taken along the line II-II' of FIG. 3. FIG. 13 illustrates a cross-sectional structure of the pixel PXL in accordance with some embodiments. FIG. 14 illustrates a cross-sectional structure of the pixel PXL in accordance with other embodiments. In FIGS. 13 and 14, for the sake of explanation, the individual components of the pixel circuit layer PCL and the display element layer DPL are schematically illustrated.

The cross-sectional structure of the pixel PXL in accordance with some embodiments will be described with reference to FIG. 13.

In some embodiments, the light emitting elements LD that are respectively located in the first sub-pixel SPXL1, the second sub-pixel SPXL2, and the third sub-pixel SPXL3 may emit the same color of light. For example, the first sub-pixel SPXL1, the second sub-pixel SPXL2, and the third sub-pixel SPXL3 may include light emitting elements LD configured to emit a light of a third color (e.g., blue light). A color conversion layer CCL and/or a color filter layer CFL may be provided in the first sub-pixel SPXL1, the second sub-pixel SPXL2, and the third sub-pixel SPXL3 so that a full-color image may be displayed. However, the present disclosure is not limited thereto. For example, the first sub-pixel SPXL1, the second sub-pixel SPXL2, and the third sub-pixel SPXL3 may include light emitting elements LD configured to emit different colors of light.

In some embodiments, the color conversion layer CCL may be located on the same layer as that of the display element layer DPL. For example, the color conversion layer CCL may be located between the banks BNK.

The color conversion layer CCL may include a wavelength conversion pattern WCP, a light transmission pattern LTP, and a first capping layer CAP1. For example, the wavelength conversion pattern WCP may include a first wavelength conversion pattern WCP1 and a second wavelength conversion pattern WCP2.

The first wavelength conversion pattern WCP1 may be located to overlap the emission area EMA of the first sub-pixel SPXL1. For example, the first wavelength conversion pattern WCP1 may be provided between the corresponding banks BNK, and overlap the emission area EMA of the first sub-pixel SPXL1 in a plan view.

The second wavelength conversion pattern WCP2 may be located to overlap the emission area EMA of the second sub-pixel SPXL2. For example, the second wavelength conversion pattern WCP2 may be provided between the corresponding banks BNK, and overlap the emission area EMA of the second sub-pixel SPXL2 in a plan view.

The light transmission pattern LTP may be located to overlap the emission area EMA of the third sub-pixel SPXL3. For example, the light transmission pattern LTP may be provided between the banks BNK, and may overlap the emission area EMA of the third sub-pixel SPXL3 in a plan view.

In some embodiments, the first wavelength conversion pattern WCP1 may include first color conversion particles that convert the light of a third color emitted from the light emitting elements LD to a light of a first color. For example, in case that each light emitting element LD is a blue light emitting element configured to emit blue light and that the first sub-pixel SPXL1 is a red pixel, the first wavelength conversion pattern WCP1 may include a first quantum dot which converts blue light emitted from the blue light emitting element to red light.

For example, the first wavelength conversion pattern WCP1 may include a plurality of first quantum dots dispersed in a matrix material (e.g., a predetermined matrix material) such as base resin. The first quantum dots may absorb blue light, may shift the wavelength thereof according to an energy transition, and thus may emit red light. In case that the first sub-pixel SPXL1 is a pixel configured to emit a different color of light, the first wavelength conversion pattern WCP1 may include first quantum dots corresponding to the color of the first sub-pixel SPXL1.

In some embodiments, the second wavelength conversion pattern WCP2 may include second color conversion particles that convert the light of a third color emitted from the light emitting elements LD to a light of a second color. For example, in case that each light emitting element LD is a blue light emitting element configured to emit blue light, and that the second sub-pixel SPXL2 is a green pixel, the second wavelength conversion pattern WCP2 may include second quantum dots which convert blue light emitted from the blue light emitting element to green light.

For example, the second wavelength conversion pattern WCP2 may include a plurality of second quantum dots dispersed in a matrix material (e.g., a predetermined matrix material) such as base resin. The second quantum dots may absorb blue light, may shift the wavelength thereof according to an energy transition, and thus may emit green light. In case that the second sub-pixel SPXL2 is a pixel configured to emit a different color of light, the second wavelength conversion pattern WCP2 may include second quantum dots corresponding to the color of the second sub-pixel SPXL2.

The first quantum dots and the second quantum dots each may have the form of a nanoparticle, a nanotube, nanofiber, a planar nanoparticle, etc. having a spherical shape, a pyramid shape, a multi-arm shape, or a cubic shape, but the present disclosure is not limited thereto. The shape of each of the first quantum dots and the second quantum dots may be changed in various ways.

In some embodiments, as blue light having a relatively short wavelength in a visible ray area is incident on each of the first quantum dots and the second quantum dots, absorption coefficients of the first quantum dot and the second quantum dot may be increased. Eventually, the efficiency of light emitted from each of the first sub-pixel SPXL1 and the second sub-pixel SPXL2 may be enhanced, and satisfactory color reproducibility may be secured. Furthermore, because the pixel unit including the first to third sub-pixels SPXL1, SPXL2, and SPXL3 is formed of light emitting elements LD configured to emit the same color of light (e.g., blue light emitting elements), the efficiency of fabricating the display device may be enhanced.

In some embodiments, the light transmission pattern LTP may be provided to efficiently use the light of a third color emitted from the light emitting elements LD. For example, in case that each light emitting element LD is a blue light emitting element configured to emit blue light and the third sub-pixel SPXL3 is a blue pixel, the light transmission pattern LTP may include at least one type of light scattering particles to efficiently use light emitted from the light emitting element LD.

For example, the light transmission pattern LTP may include a plurality of light scattering particles that are dispersed in a matrix material (e.g., a predetermined matrix material) such as base resin. For example, the light transmission pattern LTP includes light scattering particles, but the constituent material of the light scattering particles is not limited thereto.

There is no need for the light scattering particles to be located in only the emission area EMA for the third sub-pixel SPXL3. For example, the light scattering particles may also be selectively included in the first and/or second wavelength conversion pattern WCP1 and/or WCP2.

The first capping layer CAP1 may seal (or cover) the wavelength conversion pattern WCP and the light transmission pattern LTP. The first capping layer CAP1 may be located between a low refractive layer LRL and the display element layer DPL. The first capping layer CAP1 may be provided over the first to third sub-pixels SPXL1, SPXL2, and SPXL3. The first capping layer CAP1 may reduce or prevent the likelihood of the color conversion layer CCL being damaged or contaminated by permeation of external impurities such as water or air.

In some embodiments, the first capping layer CAP1 may be formed of a single layer or multiple layers including at least one insulating material among silicon oxide ($SiO_x$), silicon nitride ($SiN_x$), silicon oxynitride ($SiO_xN_y$), aluminum oxide ($AlO_x$), and titanium dioxide ($TiO_x$), but the present disclosure is not limited thereto.

An optical layer OPL may include the low refractive layer LRL and the second capping layer CAP2. The optical layer OPL may be located on the color conversion layer CCL. The optical layer OPL may be located on the display element layer DPL.

The low refractive layer LRL may be located between the first capping layer CAP1 and the second capping layer CAP2. The low refractive layer LRL may be located between the color conversion layer CCL and the color filter layer CFL. The low refractive layer LRL may be provided over the first to third sub-pixels SPXL1, SPXL2, and SPXL3.

The low refractive layer LRL may function to recycle light provided from the color conversion layer CCL by substantially total reflection, and thus may enhance the light efficiency. Hence, the low refractive layer LRL may have a relatively low refractive index compared to that of the color conversion layer CCL.

In some embodiments, the low refractive layer LRL may include base resin and hollow particles dispersed in the base resin. The hollow particles may be hollow silica particles. Alternatively, the hollow particles may have a pore formed by porogen, but the present disclosure is not limited thereto. Furthermore, the low refractive layer LRL may include at least one of a zinc oxide (ZnO) particle, a titanium dioxide ($TiO_2$) particle, and a nano-silicate particle, but the present disclosure is not limited thereto.

The second capping layer CAP2 may be located on the low refractive layer LRL. The second capping layer CAP2 may be located between the color filter layer CFL and the low refractive layer LRL. The second capping layer CAP2 may be provided over the first to third sub-pixels SPXL1, SPXL2, and SPXL3. The second capping layer CAP2 may reduce or prevent the likelihood of the low refractive layer LRL being damaged or contaminated by permeation of external impurities, such as water or air.

In some embodiments, the second capping layer CAP2 may be formed of a single layer or multiple layers including at least one insulating material among silicon oxide ($SiO_x$), silicon nitride ($SiN_x$), silicon oxynitride ($SiO_xN_y$), aluminum oxide ($AlO_x$), and titanium dioxide ($TiO_x$), but the present disclosure is not limited thereto.

The color filter layer CFL may be located on the second capping layer CAP2. The color filter layer CFL may be provided over the first to third sub-pixels SPXL1, SPXL2, and SPXL3. The color filter layer CFL may include color filters CF1, CF2, and CF3, a planarization layer PLA, and an overcoat layer OC.

In some embodiments, the color filters CF1, CF2, and CF3 may be located on the second capping layer CAP2. In a plan view, the color filters CF1, CF2, and CF3 may respectively overlap the emission areas EMA of the first to third sub-pixels SPXL1, SPXL2, and SPXL3.

In some embodiments, the first color filter CF1 may allow the light of a first color to pass therethrough, and may reduce or prevent light of a second color and light of a third color passing therethrough. For example, the first color filter CF1 may include colorant for the first color.

In some embodiments, the second color filter CF2 may allow the light of a second color to pass therethrough, and may reduce or prevent light of a first color and light of a third color passing therethrough. For example, the second color filter CF2 may include colorant for the second color.

In some embodiments, the third color filter CF3 may allow the light of a third color to pass therethrough, and may reduce or prevent light of a first color and light of a second color passing therethrough. For example, the third color filter CF3 may include colorant for the third color.

In some embodiments, the planarization layer PLA may be located on the color filters CF1, CF2, and CF3. The planarization layer PLA may cover the color filters CF1, CF2, and CF3. The planarization layer PLA may offset a step difference caused by the color filters CF1, CF2, and CF3. The planarization layer PLA may be provided over the first to third sub-pixels SPXL1, SPXL2, and SPXL3.

For instance, the planarization layer PLA may include organic material such as acrylates resin, epoxy resin, phenolic resin, polyam ides resin, polyimides resin, polyesters resin, polyphenylene sulfides resin, or benzocyclobutene (BCB). However, the present disclosure is not limited thereto. The planarization layer PLA may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The overcoat layer OC may be located on the planarization layer PLA. The overcoat layer OC may be located between an upper film layer UFL and the color filter layer CFL. The overcoat layer OC may be provided over the first to third sub-pixels SPXL1, SPXL2, and SPXL3. The overcoat layer OC may cover a lower component including the color filter layer CFL. The overcoat layer OC may reduce or prevent water or air permeating the lower component. Furthermore, the overcoat layer OC may protect the lower component from foreign material, such as dust.

In some embodiments, the overcoat layer OC may include organic material such as acrylates resin, epoxy resin, phenolic resin, polyamides resin, polyimides resin, polyesters resin, polyphenylene sulfides resin, or benzocyclobutene (BCB). However, the present disclosure is not limited thereto. The overcoat layer OC may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The upper film layer UFL may be located on the color filter layer CFL. The upper film layer UFL may be located in an outer portion of the display device DD to reduce external influence on the display device DD. The upper film layer UFL may be provided over the first to third sub-pixels SPXL1, SPXL2, and SPXL3.

In some embodiments, the upper film layer UFL may include an anti-reflective (AR) coating layer. The AR coating layer may refer to a component formed by applying material having an anti-reflective function to a surface of a specific component. Here, the material to be applied may have a low reflectivity. For example, the material that is used for the AR coating layer may include any one of $SiO_x$, $ZiO_x$, $Al_xO_y$, and $TiO_x$. However, the present disclosure is not limited thereto, and various known materials may be used.

Next, a structure of the pixel PXL in accordance with other embodiments will be described.

Referring to FIG. 14, the pixel PXL in accordance with the present embodiments differs from that of the pixel PXL in accordance with the foregoing embodiments (refer to FIG. 13) in that the color conversion layer CCL is located at a layer that is different from that of the display element layer DPL.

In some embodiments, the color conversion layer CCL may be located on the display element layer DPL. For example, the first capping layer CAP1 may seal (or cover) the area in which the light emitting elements LD are located. The color conversion layer CCL may be located on the first capping layer CAP1.

In some embodiments, the color conversion layer CCL may further include a light block layer LBL. The light block layer LBL may be located on the display element layer DPL. The light block layer LBL may be located between the first capping layer CAP1 and the second capping layer CAP2. The light block layer LBL may be located in boundaries between the first to third sub-pixels SPXL1, SPXL2, and SPXL3 to enclose the first wavelength conversion pattern WCP1, the second wavelength conversion pattern WCP2, and the light transmission pattern LTP.

The light block layer LBL may define the emission area EMA and the non-emission area NEA of the pixel PXL. For example, the light block layer may not overlap the emission area EMA, in a plan view. The light block layer LBL may overlap the non-emission area NEA, in a plan view. In some embodiments, areas in which the light block layer LBL is not located may be defined as the emission areas EMA of the first to third sub-pixels SPXL1, SPXL2, and SPXL3.

In some embodiments, the light block layer LBL may be formed of organic material including at least one of graphite, carbon block, block pigment, and black dye, or formed of metal including chrome (Cr). The material of the light block layer LBL is not limited so long as the material may reduce or prevent light transmission and absorb light.

In some embodiments, the second capping layer CAP2 may seal (or cover) the first wavelength conversion pattern WCP1, the second wavelength conversion pattern WCP2, and the light transmission pattern LTP.

In some embodiments, the low refractive layer LRL may be located between the second capping layer CAP2 and the third capping layer CAP3. The third capping layer CAP3 may be formed of a single layer or multiple layers including at least one insulating material among silicon oxide ($SiO_x$), silicon nitride ($SiN_x$), silicon oxynitride ($SiO_xN_y$), aluminum oxide ($AlO_x$), and titanium dioxide ($TiO_x$), in the same manner as that of the first capping layer CAP1 and the second capping layer CAP2, but the present disclosure is not limited thereto.

Some embodiments of the present disclosure may provide a display device in which an area large enough to arrange light emitting elements therein may be secured, so that emission efficiency may be increased, and suitable power consumption may be reduced.

Aspects of the present disclosure may not be limited to the above, and other aspects of the present disclosure will be clearly understandable to those having ordinary skill in the art from the disclosures provided with accompanying drawings.

Although embodiments of the present disclosure have been described for illustrative purposes, those skilled in the art will appreciate that various modifications, additions and substitutions are possible, without departing from the scope and spirit of the disclosure. Therefore, the above-mentioned embodiments of the present disclosure may be may be implemented separately or in combination.

Accordingly, the embodiments disclosed herein are intended not to limit but to describe the technical spirit of the present disclosure, and the scope of the present disclosure is not limited to the embodiments. The scope of the present disclosure should be construed by the appended claims, with functional equivalents thereof to be included therein, and the technical spirit within the scope of their equivalents should be construed as being included in the scope of the present disclosure.

What is claimed is:

1. A display device comprising:

a first power line and a second power line on a substrate;

a first electrode electrically connected to the first power line through a first contact portion of first contact portions successively arranged in a first direction;

a second electrode electrically connected to the second power line through a second contact portion of second contact portions, and spaced apart from the first electrode in the first direction;

a light emitting element on the first electrode and the second electrode;

a pixel circuit electrically connected to the light emitting element, and comprising a transistor, and a storage capacitor having a shape extending in a second direction that is different from the first direction in a plan view; and a bank protruding in a thickness direction of the substrate, and defining a first opening overlapping an emission area in which the light emitting element is located, and a second opening in which the first contact portion and the second contact portion are located and in which the light emitting element is not located.

2. The display device according to claim 1, further comprising a first sub-pixel configured to emit a light of a first color, a second sub-pixel configured to emit a light of a second color, and a third sub-pixel configured to emit a light of a third color, wherein the second direction crosses a direction in which the first sub-pixel, the second sub-pixel, and the third sub-pixel are spaced apart from each other.

3. The display device according to claim 1, further comprising a first sub-pixel configured to emit a light of a first color, a second sub-pixel configured to emit a light of a second color, and a third sub-pixel configured to emit a light of a third color, wherein the storage capacitor comprises a first storage capacitor in the first sub-pixel, a second storage capacitor in the second sub-pixel, and a third storage capacitor in the third sub-pixel, and wherein the first storage capacitor, the second storage capacitor, and the third storage capacitor are spaced apart from each other in a same direction in which the first sub-pixel, the second sub-pixel, and the third sub-pixel are spaced apart from each other.

4. The display device according to claim 1, wherein a maximum length or width of the storage capacitor with respect to the first direction is less than a maximum length or width of the storage capacitor with respect to the second direction.

5. The display device according to claim 1, wherein the first power line extends in a direction crossing the second direction.

6. The display device according to claim 1, further comprising a first sub-pixel configured to emit a light of a first color, a second sub-pixel configured to emit a light of a second color, and a third sub-pixel configured to emit a light of a third color, wherein the first power line extends in a same direction in which the first sub-pixel, the second sub-pixel, and the third sub-pixel are spaced apart from each other.

7. The display device according to claim 1, wherein the first power line extends in the first direction, and is between the first contact portion and the storage capacitor.

8. The display device according to claim 7, wherein the first contact portion does not overlap the first power line, in a plan view, and is electrically connected to the first power line by an electrode pattern at a same layer as the first power line.

9. The display device according to claim 1, further comprising a common connection electrode formed integrally with the second electrode, wherein the first contact portion overlaps the first electrode, and the second contact portion overlaps the common connection electrode, in a plan view.

10. The display device according to claim 1, wherein the first contact portion and the second contact portion do not overlap the bank in a plan view, and wherein at least a portion of the storage capacitor does not overlap the bank in a plan view.

11. The display device according to claim 1, wherein the first contact portions are arranged along a first line extending in the first direction, wherein the second contact portions are arranged along a second line extending in the first direction, and wherein the storage capacitor is between the first line and the second line.

12. The display device according to claim 11, wherein the first direction crosses a direction in which the storage capacitor extends.

13. The display device according to claim 11, further comprising a first sub-pixel configured to emit a light of a first color, a second sub-pixel configured to emit a light of a second color, and a third sub-pixel configured to emit a light of a third color, wherein the storage capacitor comprises a first storage capacitor for the first sub-pixel, a second storage capacitor for the second sub-pixel, and a third storage capacitor for the third sub-pixel, and wherein a direction in which the first storage capacitor, the second storage capacitor, and the third storage capacitor are arranged is substantially parallel with the first direction.

14. The display device according to claim 1, further comprising:

sub-pixels comprising the light emitting element; and a color conversion layer comprising a wavelength conversion pattern such that the sub-pixels emit different colors of light.

15. The display device according to claim 14, wherein the sub-pixels comprise a first sub-pixel configured to emit a light of a first color, a second sub-pixel configured to emit a light of a second color, and a third sub-pixel configured to emit a light of a third color, and wherein the light emitting element is configured to emit the light of the third color.

16. The display device according to claim 15, wherein the wavelength conversion pattern comprises a quantum dot configured to change a wavelength of light.

17. The display device according to claim 14, further comprising a color filter layer on the color conversion layer, and configured to allow a corresponding color of light to selectively pass therethrough.

* * * * *